(12) United States Patent
Kojima et al.

(10) Patent No.: US 7,075,336 B2
(45) Date of Patent: Jul. 11, 2006

(54) METHOD FOR DISTRIBUTING CLOCK SIGNALS TO FLIP-FLOP CIRCUITS

(75) Inventors: Naohito Kojima, Kanagawa-ken (JP);
Fumihiro Minami, Kanagawa-ken (JP);
Masami Murakata, Kanagawa-ken (JP); Takashi Ishioka, Kanagawa-ken (JP)

(73) Assignee: Kabushiki Kaisha Toshiba (JP)

( * ) Notice: Subject to any disclaimer, the term of this patent is extended or adjusted under 35 U.S.C. 154(b) by 364 days.

(21) Appl. No.: 10/184,425

(22) Filed: Jun. 28, 2002

(65) Prior Publication Data
US 2003/0014724 A1 Jan. 16, 2003

(30) Foreign Application Priority Data
Jul. 3, 2001 (JP) .............................. P2001-202579

(51) Int. Cl.
- H03K 19/00 (2006.01)
- H03K 19/096 (2006.01)
- G06F 9/45 (2006.01)
- G06F 17/50 (2006.01)
- G06F 1/12 (2006.01)

(52) U.S. Cl. .............................. 326/93; 326/94; 326/95; 326/96; 326/97; 326/98; 716/5; 716/6; 713/400; 713/401

(58) Field of Classification Search ................ 716/4–6, 716/8–10; 326/93–98; 713/400–401
See application file for complete search history.

(56) References Cited

U.S. PATENT DOCUMENTS

| 3,700,799 | A | * | 10/1972 | Stedman | 348/170 |
| 4,206,424 | A | * | 6/1980 | Nossen | 332/104 |
| 4,477,842 | A | * | 10/1984 | Kaneko | 386/49 |
| 4,780,891 | A | * | 10/1988 | Guerin et al. | 375/362 |
| 5,089,819 | A | * | 2/1992 | Yokosuka et al. | 341/101 |
| 5,402,009 | A | * | 3/1995 | Kiyota | 327/176 |
| 5,410,491 | A | * | 4/1995 | Minami | 716/6 |
| 5,507,029 | A | * | 4/1996 | Granato et al. | 716/6 |
| 5,532,625 | A | * | 7/1996 | Rajivan | 326/98 |
| 5,557,779 | A | * | 9/1996 | Minami | 716/6 |
| 5,608,645 | A | * | 3/1997 | Spyrou | 716/6 |
| 5,654,898 | A | * | 8/1997 | Roetcisoender et al. | 716/9 |
| 5,671,259 | A | * | 9/1997 | Thomas et al. | 375/371 |
| 5,691,662 | A | * | 11/1997 | Soboleski et al. | 327/292 |

(Continued)

FOREIGN PATENT DOCUMENTS

JP 1079194 * 3/1998

(Continued)

Primary Examiner—Rexford Barnie
Assistant Examiner—Jason Crawford
(74) Attorney, Agent, or Firm—DLA Piper Rudnick Gray Cary US LLP

(57) ABSTRACT

A method for distributing clocks to flip-flop circuits which constitute a logic circuit includes obtaining a timing slack of a first minimum delay time with respect to a minimum delay constraint time and a timing slack of a first maximum delay time with respect to a maximum delay constraint time for a clock in an input path to a flip-flop circuit, obtaining a timing slack of a second minimum delay time with respect to a minimum delay constraint time and a timing slack of a second maximum delay time with respect to a maximum delay constraint time for a clock in an output path from all the flip-flop circuits which receive the clocks from a clock terminal directly and obtaining a delay value which maximizes a minimum value of each of the first and second minimum delay time and maximum delay time of timing slacks.

30 Claims, 14 Drawing Sheets

U.S. PATENT DOCUMENTS

| | | | |
|---|---|---|---|
| 5,812,562 A * | 9/1998 | Baeg | 714/726 |
| 5,896,299 A * | 4/1999 | Ginetti et al. | 716/4 |
| 6,003,147 A * | 12/1999 | Stephens et al. | 714/701 |
| 6,023,568 A * | 2/2000 | Segal | 716/6 |
| 6,023,767 A * | 2/2000 | Kumar et al. | 713/400 |
| 6,041,168 A * | 3/2000 | Hasegawa | 716/6 |
| 6,055,277 A * | 4/2000 | Stephens et al. | 375/285 |
| 6,072,347 A * | 6/2000 | Sim | 327/276 |
| 6,109,201 A * | 8/2000 | Petranovic et al. | 116/21 |
| 6,134,217 A * | 10/2000 | Stiliadis et al. | 370/232 |
| 6,208,092 B1 * | 3/2001 | Kim | 315/370 |
| 6,289,068 B1 * | 9/2001 | Hassoun et al. | 375/376 |
| 6,300,807 B1 * | 10/2001 | Miyazaki et al. | 327/158 |
| 6,304,609 B1 * | 10/2001 | Stephens et al. | 375/259 |
| 6,336,205 B1 * | 1/2002 | Kurokawa et al. | 716/2 |
| 6,356,555 B1 * | 3/2002 | Rakib et al. | 370/441 |
| 6,434,731 B1 * | 8/2002 | Brennan et al. | 716/10 |
| 6,442,739 B1 * | 8/2002 | Palermo et al. | 716/6 |
| 6,473,891 B1 * | 10/2002 | Shively | 716/12 |
| 6,513,149 B1 * | 1/2003 | Donato | 716/12 |
| 6,516,003 B1 * | 2/2003 | Nonaka et al. | 370/474 |
| 6,543,042 B1 * | 4/2003 | Kato | 716/10 |
| 6,564,360 B1 * | 5/2003 | Chiu | 716/6 |
| 6,594,806 B1 * | 7/2003 | Casavant | 716/6 |
| 6,701,507 B1 * | 3/2004 | Srinivasan | 716/10 |
| 6,763,506 B1 * | 7/2004 | Betz et al. | 716/6 |
| 6,876,940 B1 * | 4/2005 | Mittal | 702/117 |
| 2001/0005898 A1 * | 6/2001 | Yamamoto et al. | 714/815 |
| 2001/0015667 A1 * | 8/2001 | Takahashi | 327/278 |
| 2001/0033630 A1 * | 10/2001 | Hassoun et al. | 375/376 |
| 2001/0047450 A1 * | 11/2001 | Gillingham et al. | 711/105 |
| 2001/0054171 A1 * | 12/2001 | Furumoto et al. | 716/6 |
| 2001/0056332 A1 * | 12/2001 | Abrosimov et al. | 702/89 |
| 2002/0022949 A1 * | 2/2002 | Yonezawa et al. | 703/14 |
| 2002/0029361 A1 * | 3/2002 | Kasahara | 714/726 |
| 2005/0022141 A1 * | 1/2005 | Walker et al. | 716/2 |
| 2005/0050497 A1 * | 3/2005 | Tetelbaum | 716/6 |
| 2005/0129133 A1 * | 6/2005 | Liu | 375/246 |

FOREIGN PATENT DOCUMENTS

| | | |
|---|---|---|
| JP | 10-326303 | 8/1998 |

* cited by examiner

FIG.12

| | |
|---|---|
| F/F0 | [< EACH 1/6 >] |
| F/F1 | [<--- EACH 1/9--->] |
| F/F2 | [<---EACH 1/9--->] |
| F/F3 | [<1/3] |
| F/F4 | [<----->] EACH 1/4 |
| F/F5 | [<----->] EACH 1/5 |
| F/F6 | [<-EACH 1/7->] |
| Slot | |A|B|C|D|E|F|G|H| I | J |K|L|M|N|O|P|Q |

FIG.13

TOTAL (DEGREE OF PRESENCE OF F/F) FOR EACH SLOT

| |
|---|
| A 0.111, B 0.111, C 0.253, D 0.253, E 0.253, F 0.670, G 1.203, H 1.203, I 1.314, |
| J 0.478, K 0.478, L-Q 0.111 |

.    .    .    .    .    .    .    .
Slot              |A|B|C|D|E|F|G|H| I | J |K|L|M|N|O|P|Q
```

FIG.15

F/F (DESCRIBE IN ORDER OF DECISION)

```
                                                      2
                1
                    6
                                            5
                            4
                                        0
                                    3
POSITION OF Di OF F/Fi  1   6    4  3   0 5           2
     Slot              |A|B|C|D|E|F|G|H| I | J |K|L|M|N|O|P|Q
```

METHOD FOR DISTRIBUTING CLOCK SIGNALS TO FLIP-FLOP CIRCUITS

CROSS REFERENCE TO RELATED APPLICATIONS

This application is based upon and claims the benefit of priority from the prior Japanese Patent Application No. P2001-202579, filed on Jul. 3, 2001; the entire contents of which are incorporated herein by reference.

BACKGROUND OF THE INVENTION

1. Field of the Invention

The present invention relates to a clock distribution method for setting an optimal skew of a logic circuit, which obtains an optimal skew between registers on an LSI clock tree circuitry, a clock tree generating method to structure a clock tree when a useful skew is used, a clock delay setting method to minimize noise generated by a circuit, and a circuitry process method for a logic circuit using a useful skew.

2. Description of the Related Art

Conventionally, in digital logic integrated circuits, sequential circuits, typically registers and flip-flop circuits, are used, and the entire of the circuit operates in synchronization with a plurality of clock signals each of which are at a different phase and cycle.

It is common that the propagation delay time (hereinafter referred to as "delay") of clock signals to be supplied to the flip-flop circuits differ for each flip-flop circuit, and a phase difference associated therewith is called a clock skew (hereinafter referred to as "a skew"). One problem, which arises quite often in designing digital logic integrated circuits, is that this skew becomes so large that the synchronization operation of circuits cannot be performed at a desired clock frequency. For this reason, an on-chip clock skew reduction method is proposed, and a skew value zero is provided between each register included in the sequential circuit and other registers which have the relationship of the connection of a signal that has passed through a combinational circuit therebetween.

However, in place of the so-called zero skew, in which skew value zero is provided between each register included in the sequential circuit and other registers which have the relationship of connection of a signal that has passed through a combinational circuit therebetween, in recent years there is a method using a useful skew that provides a skew value Δ therebetween. This makes it possible to avoid simultaneous switching of flip-flop circuits to reduce a peak value and to reduce the generation of noise. Also, this makes it possible to stabilize a circuit voltage. Moreover, in the case of zero skew, if even one flip-flop circuit of the logic circuit does not satisfy a predetermined requirement, the entirety of circuit does not work well. However, the use of useful skew makes it possible to operate a flip-flop circuit which does not require the predetermined requirement in the case of zero skew properly, and to avoid a problem in which the entirety of circuit does not work well.

Regarding the circuitry process of the aforementioned logic circuit, as illustrated in FIG. 1, after performing a data path section delay calculation process S11, a clock delay assignment process S12 and a clock circuitry process S13 in a cell positioning process S10, an outline circuitry process S20 for general signal circuitry is carried out Thereafter, a specific circuitry process S30 for general signal circuitry is performed, so that the circuitry is ended.

Alternatively, as illustrated in FIG. 2, after performing the data path section delay calculation process S11 and the clock delay assignment process S12 in the cell positioning process S10, the outline circuitry process S20 for general signal circuitry is carried out. Thereafter, in the specific circuitry process S30 for general signal circuitry, a clock circuitry process S31 is performed to end the circuitry.

A "Clock distributing method" using the above-explained useful skew, which is disclosed in Japanese Patent Laid-Open No. 10-326303, can be explained as follows:

Specifically, for forming a clock tree, a delay analysis is carried out to obtain an allowance with respect to constraint time for both input and output sides for each flip-flop circuit to insert delay to a clock. Then, a suitable flip-flop circuit is selected from among the flip-flop circuits that meet this constraint at both sides even if delay is inputted to the clock, and delay is inputted to the clock to make a difference with respect to a change in the other clocks so as to avoid a concentration of change in the clock.

This method has the problem as follows.

Specifically, consideration is given to only the point set forth below:

Namely, a subgroup of flip-flops is taken from the flip-flop circuits in the circuit, and delay is added to clock signals of these circuits uniformly or reduced so as to decrease a peak current.

However, it is a precondition that no violation of timing constraint exists in the logic circuit. The above method does not consider the reduction of violation by adding and subtracting the delay of clock signals when the violation of timing constraint exists before this method is applied. Accordingly, this method does not fully bring out the merit of using the useful skew.

Clockwise processing by Ultima described in "Using clock skew for optimaltiming" in the article of "Integrated System Design" April, 1999(http://isdmag.com) is also one of conventional methods using the useful skew. This method can be explained as follows:

Specifically, a permissible range or a skew boundary of a skew value between registers is gained based on a maximum delay time of the combinational circuit between the registers, a minimum delay time thereof and a clock cycle. Next, the skew value between the respective registers is set to a value, which is as close as possible to the center of the skew boundary, such that no contradiction occurs between all registers. In this article at least, there is no description of a specific method for reducing the clock cycle to accelerate the circuit operation. In addition, there is a description about reduction in the peak current value because of the fact that zero skew is not applied. However, there is no description about an algorithm such as a point that the skew value is aggressively set to a value away from the center of the skew boundary, thereby reducing the peak current value positively.

Moreover, in addition to the foregoing, in the conventional method, the presence of combinational circuits among all registers and the provision of the signal delay time information are preconditions. However, in the large-scaled circuit, it is not uncommon for the number of registers to exceed a few thousands, so that the number of combinational circuits among the registers becomes considerably large. Accordingly, the presence of combinational circuits among all registers and the signal delay time information enormously increases, causing a problem of increasing necessary memory amounts and processing time.

Still moreover, in addition to the foregoing, the conventional method is equally compliant with setup time constraints and hold time constraints of the circuit For this reason, in the circuit when both constraints are severe, both the violation of setup constraint (constraint of an upper limit to signal delay time between two points) and that of hold time constraint (constraint of a lower limit to signal delay time between two points) are left at the same amount even if the useful skew is used.

The violation of setup time constraint is solved by the adjustment of the clock frequency, and that of hold time constraint is solved by the adjustment of the clock skew. Namely, since two different solution methods had to be provided, there was difficulty in correcting the circuit afterward in some cases.

In structuring the clock tree when the useful skew is used as mentioned above, there have been cases in which the skews are not reduced sufficiently when a bias is found in the distribution of the presence of F/F on the chip, for example, when an extremely small number of F/Fs is found in the vicinity of a root driver while a large number of F/Fs is found at a distance, in an H tree-type clock layout, which is a conventional tree generating method. At such times, the layout that satisfies the delay constraint is not achieved in some cases since an alternative path was generated as compared with a case in which the root driver and each F/F are connected at the shorted path of point to point, in terms of the tree structure. Also, there has been a case in which a useless buffer is inserted or an alternative path is generated in order to reduce the skews.

Further, in the conventional circuitry process of the aforementioned logic circuit, after cell positioning process is performed and before circuitry is performed, (1) data path section delay calculation process and (2) clock delay assignment process are performed. For this reason, no consideration is given to the clock delay due to circuitry, and there has been concern that accuracy is poor and the clock can not be delayed according to the design when delay in the clock is slightly adjusted by use of the useful skew.

SUMMARY OF THE INVENTION

According to a first aspect of the present invention, a method for distributing clocks to flip-flop circuits which constitute a logic circuit includes obtaining a timing slack of a first minimum delay time with respect to a minimum delay constraint time and a timing slack of a first maximum delay time with respect to a maximum delay constraint time for a clock in an input path to a flip-flop circuit, obtaining a timing slack of a second minimum delay time with respect to a minimum delay constraint time and a timing slack of a second maximum delay time with respect to a maximum delay constraint time for a clock in an output path from all the flip-flop circuits which receive the clocks from a clock terminal directly and obtaining a delay value which maximizes a minimum value of each of the first and second minimum delay time and maximum delay time of timing slacks.

According to a second aspect of the present invention, a method for distributing clocks to flip-flop circuits which constitute a logic circuit includes performing constraint verification as to whether a first minimum delay time of a clock in an input path to a flip-flop circuit is larger than a minimum delay constraint time, performing a constraint verification as to whether all of respective first maximum delay times of a clock in an output path from all the flip-flop circuits which receive the clocks from a clock terminal directly are smaller than a maximum delay constraint time, obtaining a first degree of allowance, which is a difference between the respective delay times of the minimum delay time of the clock and the maximum delay time of the clock with respect to the maximum delay constraint time and the maximum delay constraint time, performing a constraint verification as to whether a second maximum delay time of the clock in the input path to the flip-flop circuit is smaller than a maximum delay constraint time, performing a constraint verification as to whether all of respective second minimum delay times of the clock in the output path from all the flip-flop circuits which receive the clocks from the clock terminal directly are larger than a minimum delay constraint time to which a clock skew in clock distribution is added and obtaining a second degree of allowance, which is the difference between respective delay times of the maximum delay time of the clock and the minimum delay time of the clock with respect to the maximum delay constraint time and the minimum delay constraint time.

According to a third aspect of the present invention, a method for distributing clocks to flip-flop circuits which constitute a logic circuit includes performing a first constraint verification as to whether a first maximum delay time of a clock in an input path to a flip-flop circuit is larger than a maximum delay constraint time and whether there is a violation; and performing a second constraint verification as to whether there is a violation in which at least one of first respective minimum delay times of a clock in an output path from any one of the flip-flop circuits which receive the clocks from a clock terminal directly is smaller than a corresponding minimum delay constraint time.

According to a fourth aspect of the present invention, a method in which a permissible range of a clock signal delay time from a clock input terminal of a logic circuit to an input of each flip-flop circuit that constitutes the logic circuit is set as a skew boundary and in which a signal delay time of each flip-flop circuit is set within the skew boundary, wherein the signal delay time of the flip-flop circuit is dispersed and there is an absence of overlap.

According to a fifth aspect of the present invention, a method in which a permissible range of a clock signal delay time from a clock input terminal of a logic circuit to an input of each flip-flop circuit that constitutes the logic circuit is set as a skew boundary and in which a signal delay time of each flip-flop circuit is set within the skew boundary includes extracting a unit time width where there is a flip-flop circuit having a degree of presence larger than zero and is the smallest of unit time widths set at a time axis that counts the skew boundary by a first extracting process, wherein the degree of presence indicates total probability of presence of flip-flop circuits in the unit time, comparing numeric values where degrees of presence of two adjacent unit time widths are added to extract a minimum unit time width by a second extracting process when the number of the extracted unit time widths whose degree of presence is the smallest is more than two or more, using the extracted unit time width as a first slot, assigning a flip-flop circuit having the smallest flexibility of the flip-flop circuits, which can be present in the first slot, to the first slot and executing an update process of the degree of presence of the flip-flop circuit having a delay time that is present in each unit time width.

According to a sixth aspect of the present invention, a method for generating a clock tree of a logic circuit, wherein a plurality of buffers inserted between a root driver and an H tree are replaced by one buffer, and the root driver and the replaced buffer are connected to each other by circuitry.

According to a seventh aspect of the present invention, a method for generating a clock tree of a logic circuit includes classifying flip-flop circuits which have similar target delays to each other for each target delay as groups of flip-flop circuits, making the group of flip-flops with the largest target delay close to the target delay, and re-classifying the flip-flop circuits which have similar target delays to each other for each target delay as groups of flip-flop circuits.

According to an eighth aspect of the present invention, a method for a circuitry process includes a cell positioning process, an outline circuitry process for a general signal circuitry and a specific circuitry process for the general signal circuitry, wherein a delay calculation process for a data path section and a clock delay assignment process are carried out in the outline circuitry process for the general signal circuitry.

BRIEF DESCRIPTION OF THE DRAWINGS

FIG. 11 is a view in which FIG. 10 is divided at equal time intervals to time units called slots;

FIG. 12 is a view showing the probability of the presence of a flip-flop circuit in each slot;

FIG. 13 is a diagram showing a calculation result of a degree of probability of a flip-flop circuit existing in each slot;

FIG. 14 is a view showing the steps for executing an optimization process for an initial solution;

FIG. 15 is a view showing a position of Di of the flip-flop circuit to the slot after performing optimization process;

DETAILED DESCRIPTION OF THE INVENTION

Figure 1:
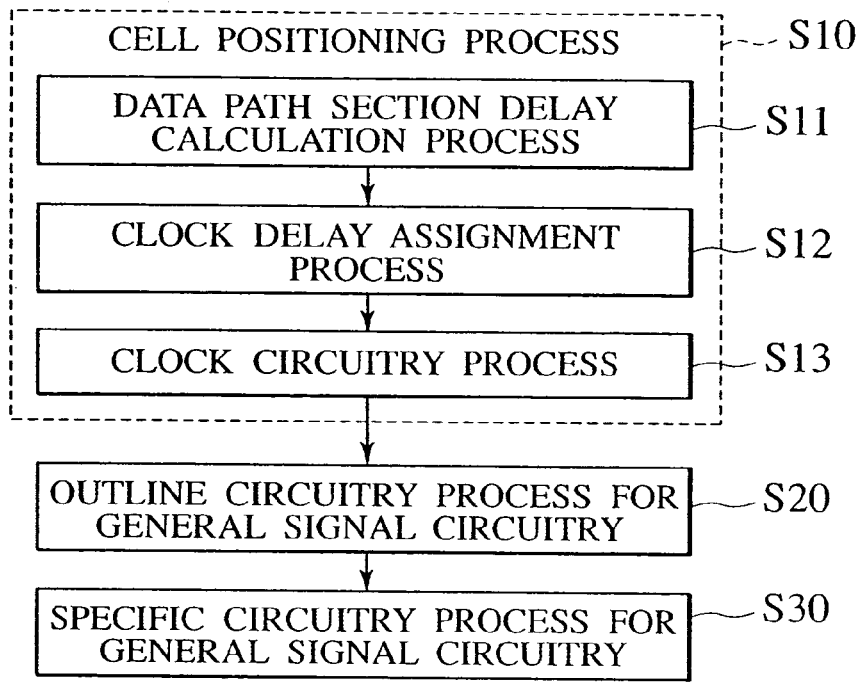
FIG. 1 is a flowchart explaining the steps of a circuitry process of a logic circuit.
Figure 2:
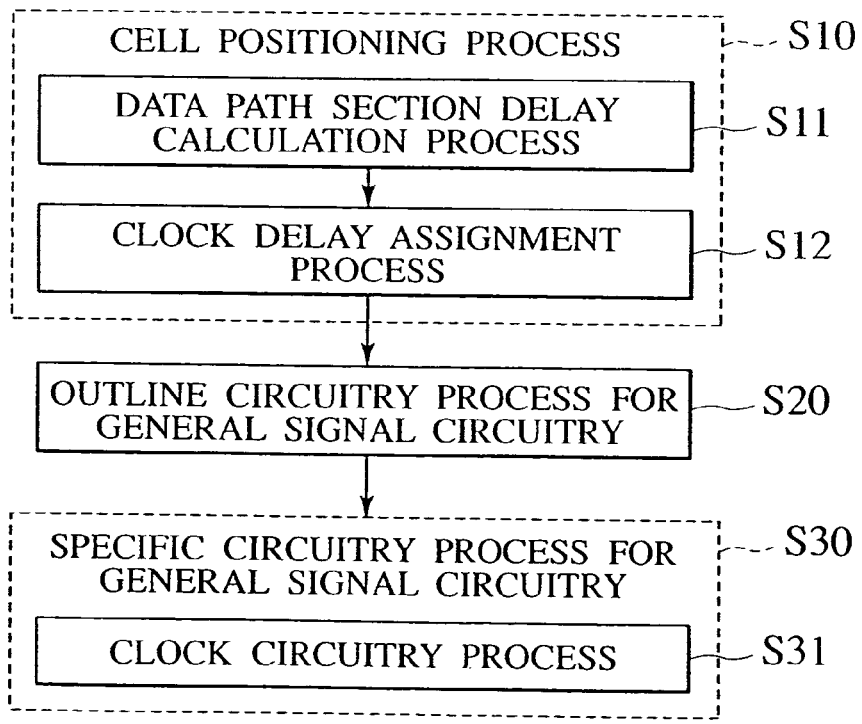
FIG. 2 is a flowchart explaining the steps of other circuitry process of the logic circuit.

In the following descriptions, numerous specific details are set forth such as delay time values, etc. to provide a through understanding of the present invention. However, it will be obvious to those skilled in the art that the present invention may be practiced without such specific details.

FIRST EMBODIMENT

A clock distributing method according to a first embodiment of the present invention will be explained with reference to the flowchart of FIG. 3 and the block diagram of FIG. 4. First, a circuit shown in FIG. 4 includes a flip-flop circuit F/Fi (hereinafter simply referred to as F/Fi or F/Fi circuit) $11i$ that receives an input signal from an external input terminal 10 and a clock signal from a CLK terminal 14, a first combinational circuit $12a$ that receives an output from the F/Fi circuit $11i$, an F/Fj circuit $11j$ that receives an output from the first combinational circuit $12a$ and a clock signal from the CLK terminal 14, a second combinational circuit $12b$ that receives an output from the F/Fj circuit $11j$, an F/Fk circuit $11k$ that receives an output from the second combinational circuit $12b$ and a clock signal from the CLK terminal 14, and an external output terminal 13 that finally outputs a signal from the F/Fk circuit $11k$. Here, it is assumed that the delay time of the clock signal from the CLK terminal 14 to a clock input terminal of the flip-flop circuit F/Fi is Di where i=i, j, or k.

First, in step S101, maximum and minimum delay times of the combinational circuits $12a$ and $12b$ between the respective flip-flop circuits F/Fi ($11i$, $11j$, $11k$) are read. Next, in step S102, a degree of allowance (timing slack) of each flip-flop circuit F/Fi is obtained from the conditions with respect to preceding and succeeding flip-flop circuits F/Fi, and a central value of the obtained timing slack is obtained as an optimal value Dopti. Then, in step S103, a difference Si between the optimal value Dopti and a current Di is obtained.

Each flip-flop circuit F/Fi ($11i$, $11j$, $11k$) is inserted to a priority queue P.Q.) using Si as a key in step S104, and one flip-flop circuit F/Fi having a maximum absolute value of Si is extracted from P.Q. in step S105. Namely, adjustment is performed in decreasing order of the difference between the optimal value Dopti and the current Di. Next, in step S106, it is determined whether or not the maximum absolute value of Si obtained is equal to or less than a designated value. When it is less than the designated value, the processing is ended.

The point that the maximum absolute value of Si is equal to or less than the designated value means that all flip-flop circuits F/Fi are substantially at the center of the timing slack within a permissible range. This operates the entirety of circuit even if there are some variations in clock skews.

However, when the maximum absolute value is not equal to or less than the designated value in step S106, the clock skew is adjusted such that Di is shifted by Si/2, thereafter Dopti of all other flip-flop circuits connected to the flip-flop circuit F/Fi through the combinational circuits is obtained to re-calculate S and to update P.Q. in step S107. At this time, it is determined whether or not a clock frequency is maximized in step S108, and when no maximization is performed, processing goes back to step S105, and the processing is repeated until the maximum absolute value of Si extracted in step S106 reaches a value equal to or less than the designated value.

While, the clock frequency is maximized in step S108, the clock cycle is reduced by a half of the minimum value of a skew boundary (a permissible range of a clock delay time from the CLK terminal 14 to the clock input terminal of F/Fi) of each F/Fi and the processing goes back to step S105. Namely, the clock frequency is increased gradually, and the processing is repeated until the maximum absolute value of Si extracted in step S106 reaches a value equal to or less than the designated value. It is thereby possible to improve a processing speed of a logic circuit by increasing the clock frequency little by little until one of the flip-flop circuits F/Fi reaches a minimum degree of allowance that is designed by a user.

Figure 5:
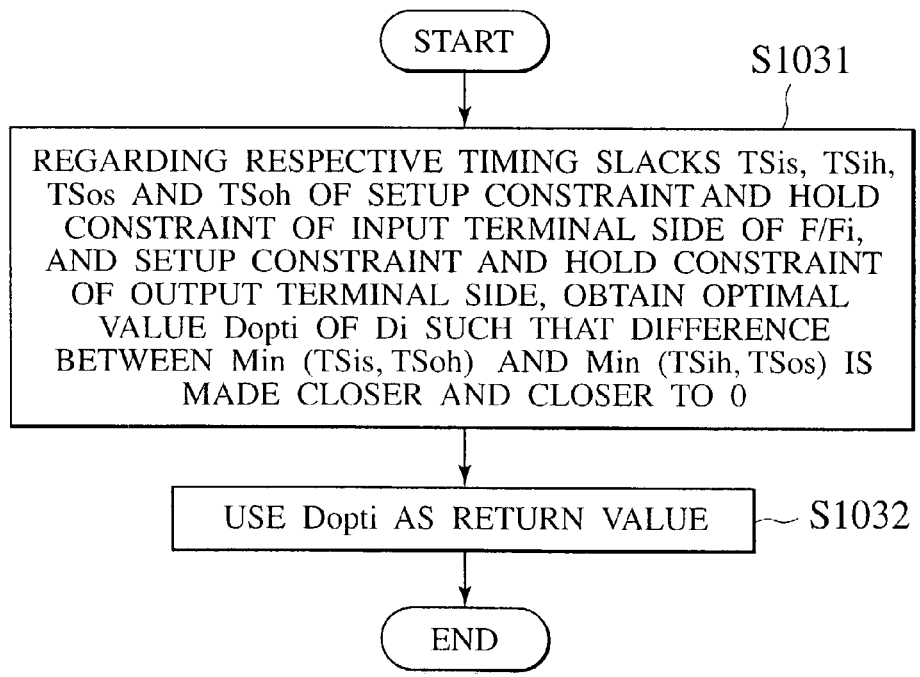
FIG. 5 is a sub-routine of a process in S102 shown in FIG. 3.

Here, regarding the respective timing slacks TSis, TSih, TSos and TSoh for the setup constraints of an input terminal side of F/Fi, hold constraints thereof, setup constraints of an output terminal side and hold constraint thereof, a subroutine of step S102 obtains an optimal value Dopti of Di such that a difference between Min (TSis, TSoh) and Min (TSih, TSos) is made closer and closer to zero in step S1031 as shown in FIG. 5. Next, in step S1032, the obtained optimal value Dopti is used as a return value.

An explanation will be next given of a specific calculation method for obtaining the optimal value Dopti in step S1031 in detail.

(1) Variables and constants are defined as follows. Also, it is assumed that a signal flows from a signal output terminal of F/Fi to a signal input terminal of F/Fj.

Tcp is a clock cycle;

Di is a clock delay time from the CLK terminal 14 to the clock input terminal of F/Fi(11$i$);

Dj is a clock delay time from the CLK terminal 14 to the clock input terminal of F/Fj(11$j$);

Tfi is a clock delay time from the clock input terminal of F/Fi (11$i$) to a signal output terminal thereof, Tdij is a delay time (with a maximum value and a minimum value) of the combinational circuit 12$a$ between F/Fi (11$i$) and F/Fj (11$j$);

Tsetupj is a setup time margin of F/Fj (11$j$); and

Tholdj is a hold time margin of F/Fj (11$j$).

At this time, the setup time constraint can be given by the following expression (1):

$$Di + Tfi + \max(Tdij) < Tcp + Dj - T\text{setup}j \quad (1)$$

The holdtime constraint can be given by the following expression (2):

$$Di + Tfi + \min(Tdij) > Dj - T\text{hold}j \quad (2)$$

(2) An explanation will be given of formulating each condition. In connection with any items shown below, an objective function is realized under the condition of the obtained constraint, making it possible to achieve maximization of the yield of the circuit, maximization of the clock frequency, or reduction in noise.

For example, at the time of deciding Dj in the flip-flop circuits F/Fi, F/Fj and F/Fk that are continuous along a signal flow direction, the following constraints are considered.

The timing slack (degree of allowance) estimated by the setup constraint at the input side of F/Fj, namely, between F/Fi and F/Fj is defined as follows:

$$TSis = (Tcp + Dj - T\text{setup}k) - (Di + Tfi + \max(Tdij)) \quad (3)$$

The timing slack estimated by the hold constraint at the input side of F/Fj, namely, between F/Fi and F/Fj is defined as follows:

$$TSih = (Di + Tfi + \min(Tdij)) - (Dj + T\text{hold}j) \quad (4)$$

The timing slack estimated by the setup constraint at the output side of F/Fj, namely, between F/Fj and F/Fk is defined as follows:

$$TSos = (Tcp + Dk - T\text{setup}k) - (Dj + Tfj + \max(Tdjk)) \quad (5)$$

The timing slack estimated by the hold constraint at the output side of F/Fj, namely, between F/Fj and F/Fk is defined as follows:

$$TSoh = (Dj + Tfj + \min(Tdjk)) - (Dk + T\text{hold}k) \quad (6)$$

Though the aforementioned TSis, TSih, TSos, and TSoh must be increased in order to increase a timing margin, the timing margin itself is decided by a minimum value of TSis, TSih, TSos, and TSoh.

In other words, maximization of the timing margin is no more than maximizing the minimum value of TSis, TSih, TSos, and TSoh.

A specific method for obtaining q can be given as follows. Equations for obtaining TSis, TSih, TSos, and TSoh are deformed as follows:

$$\begin{aligned} TSis &= (Tcp + Dj - Tsetupk) - (Di + Tfi + \max(Tdij)) \\ &= Dj - ((Di + Tfi + \max(Tdij)) - (Tcp - Tsetupk)) \\ &= Dj - A \end{aligned} \quad (7)$$

$$\begin{aligned} TSoh &= (Dj + Tfj + \min(Tdjk)) - (Dk + Tholdk) \\ &= Dj - ((Dk + Tholdk) - (Tfj + \min(Tdjk))) \\ &= Dj - B \end{aligned} \quad (8)$$

$$\begin{aligned} TSih &= (Di + Tfi + \min(Tdij)) - (Dj + Tholdj) \\ &= ((Di + Tfi + \min(Tdij)) - (Tholdj)) - Dj \\ &= C - Dj \end{aligned} \quad (9)$$

$$\begin{aligned} TSos &= (Tcp + Dk - Tsetupk) - (Dj + Tfj + \max(Tdjk)) \\ &= ((Tcp + Dk - Tsetupk) - (Tfj + \max(Tdjk))) - Dj \\ &= D - Dj \end{aligned} \quad (10)$$

From the above, the minimum value of TSis, TSih, TSos, and TSoh can be expressed as follows:

$$\min(Dj-A, Dj-B, C-Dj, D-Dj) \quad (11)$$

This can be deformed as follows:

$$\min(Dj-\max(A,B), \min(C,D)-Dj) \quad (12)$$

At this time, the expression (13) is deformed as for each case with regard to a possible range of Dj.

$$\min(Dj-\max(A,B), \min(C,D)-Dj) \quad (13)$$

In the case of the expression (14), the expression (15) is given as:

$$Dj \leq (\max(A,B) + \min(C,D))/2 \quad (14)$$

$$Dj - \max(A,B) \quad (15)$$

In the case of the expression (16), the expression (17) is given as:

$$Dj \geq (\max(A,B)+\min(C,D))/2 \quad (16)$$

$$\min(C,D)-Dj \quad (17)$$

Accordingly, the value of Dj that maximizes the expression (18) and the maximum value at this time are deformed as below for each case in regard to a possible range of Dj.

$$\min(Dj-\max(A,B), \min(C,D)-Dj) \quad (18)$$

In the case of the expression (19), the expressions (20) and (21) are given as:

$$Dj \leq (\max(A,B)+\min(C,D))/2 \quad (19)$$

$$Dj = (\max(A,B)+\min(C,D))/2 \quad (20)$$

$$(\min(C,D)-\max(A,B))/2 \quad (21)$$

In the case of the expression (22), the expressions (23) and (24) are given as:

$$Dj \geq (\max(A,B)+\min(C,D))/2 \quad (22)$$

$$Dj = (\max(A,B)+\min(C,D))/2 \quad (23)$$

$$(\min(C,D)-\max(A,B))/2 \quad (24)$$

From the above, the value of Dj that maximizes the minimum value of TSis, TSih, TSos, and TSoh is given by the following expression (25):

$$(\max(A,B)+\min(C,D))/2 \quad (25)$$

At this time, the minimum value of TSis, TSih, TSos, and TSoh is given by the following expression (26):

$$(\min(C,D)-\max(A,B))/2 \quad (26)$$

In the case of the expression (27), the timing margin is maximized, while the setup and hold constraints of both input and output of F/Fj (11j) are satisfied.

$$(\min(C,D)-\max(A,B))/2 \geq 0 \quad (27)$$

Moreover, regarding the minimization of the clock cycle, since the clock cycle has no relation to the hold time constraint consideration is given to only the aforementioned setup time constraint.

Regarding the setup time constraint, the following expression is given in all combinations of i and j.

$$(Tcp+Dj-T\text{setup})-(Di+Tfi+\max(Tdij))>0 \quad (28)$$

At this time, the minimization of Tcp under the above-described constraint is used as an objective function.

According to the first embodiment, in consideration of the condition of the preceding and succeeding flip-flop circuits of F/Fi that constitute the logic circuit, the degree of allowance of F/Fi is obtained, and the clock skew is adjusted such that Di of F/Fi reaches substantially the center of the degree of allowance. Thereby, even if the operation timing of F/Fi is shifted by variations of the manufacturing process, it is possible to absorb this shift by the degree of allowance and to manufacture a logic circuit that performs a normal operation as a circuit As a result, yield of the circuit can be maximized.

Moreover, as mentioned above, the degree of allowance of F/Fi is obtained, and the clock skew is adjusted such that Di of F/Fi substantially reaches the center of the degree of allowance. Thereafter, the clock frequency is increased until the degree of allowance of F/Fi reaches a value that is preset by the user, making it possible to improve the minimization of the clock cycle and to accelerate the operation of the circuit.

SECOND EMBODIMENT

Figure 3:
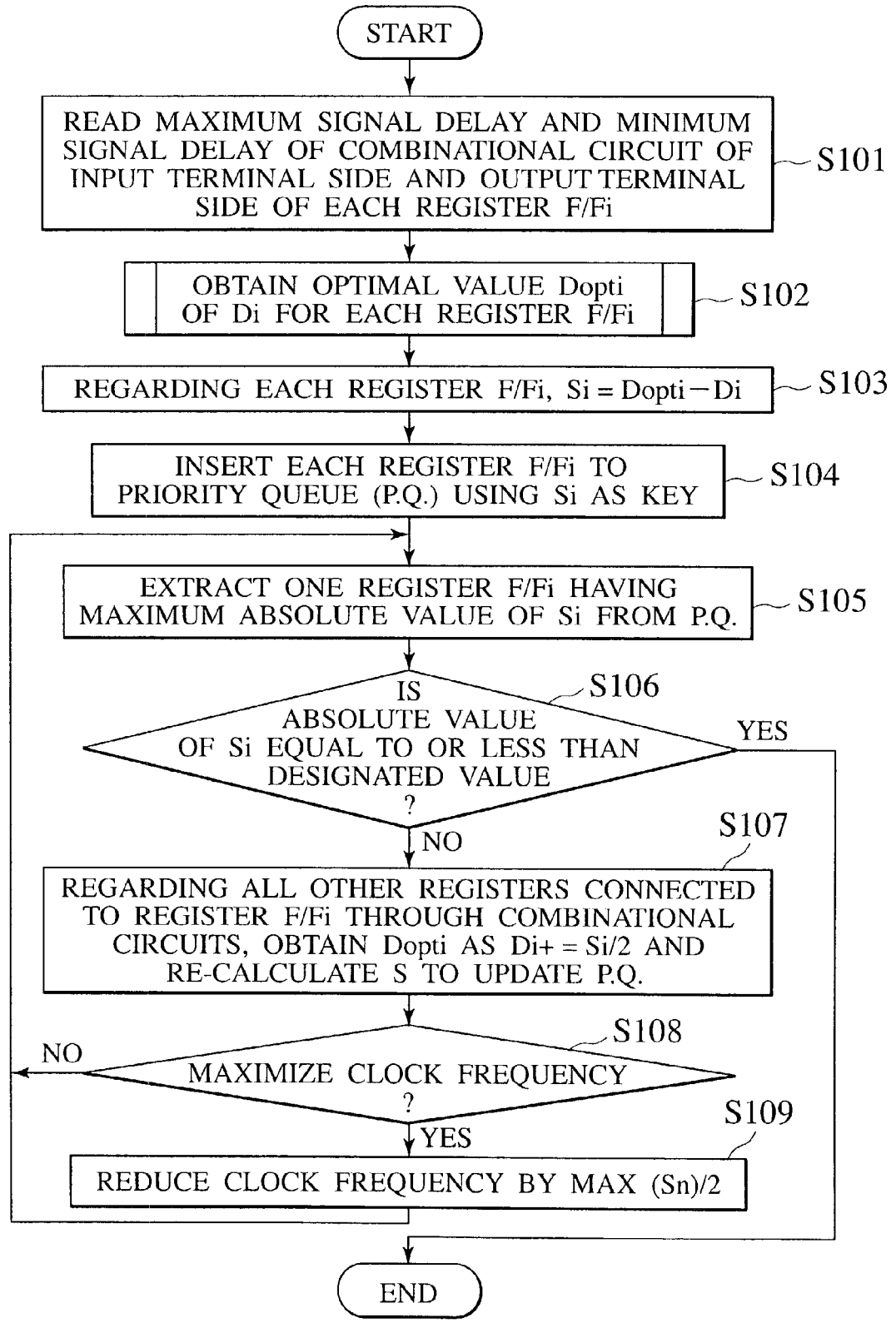
FIG. 3 is a flowchart showing the steps of a clock distributing method of a first embodiment according to the present invention.
Figure 4:
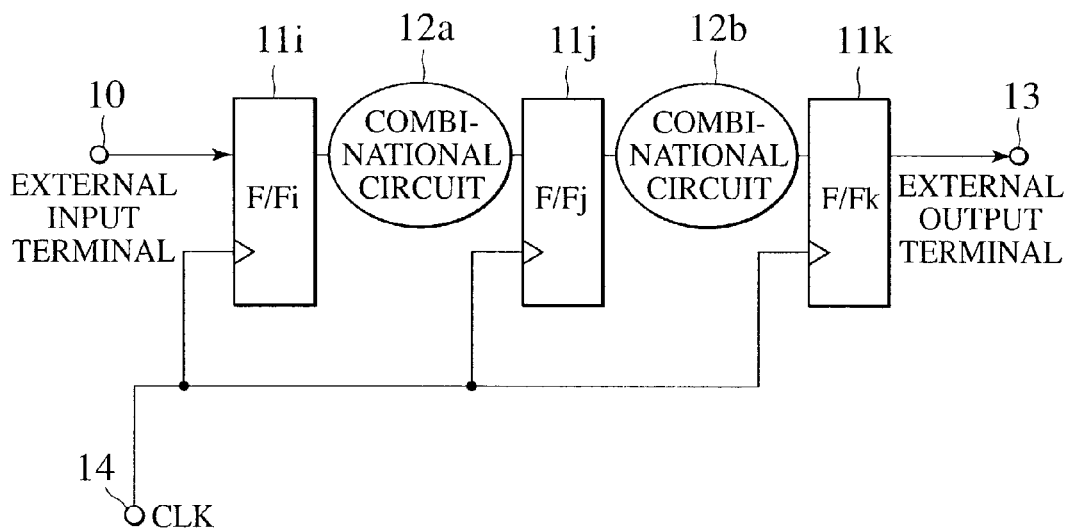
FIG. 4 is a block diagram showing an example of an arrangement of flip-flop circuits in a logic circuit.
Figure 6:
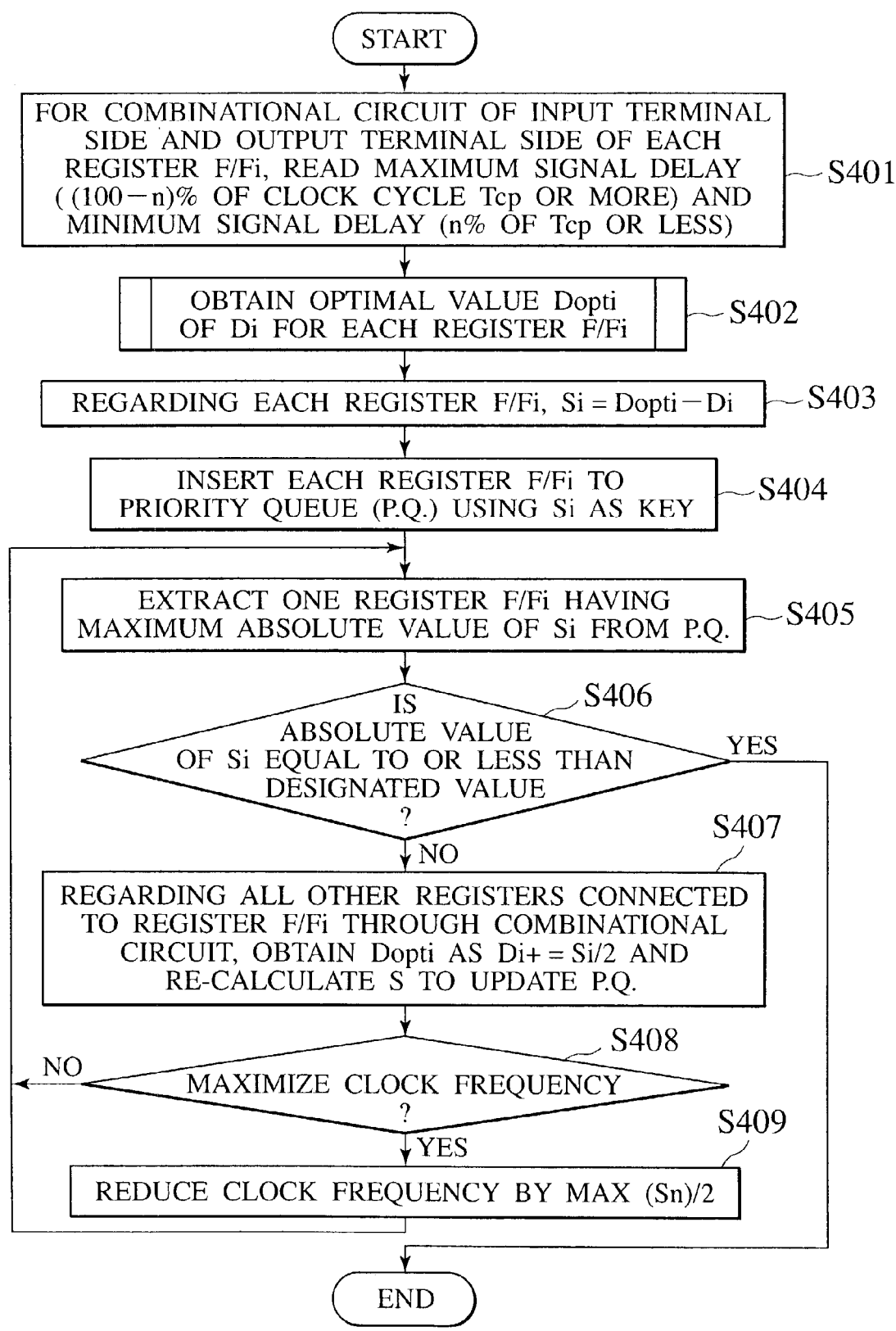
FIG. 6 is a flowchart showing the steps of a clock distributing method of a second embodiment according to the present invention.

The processes in steps of a second embodiment shown by a flowchart of FIG. 6 are substantially the same as those of the first embodiment shown by FIG. 3. However, to obtain a useful skew, it is necessary to add signal delay information of the combinational circuit between the flip-flop circuits F/F, so that the number of combinational circuits becomes considerably large, resulting in an increase in memory amounts and processing time used.

In order to prevent the above problem, step S401 is performed in the following manner, which is different from the first embodiment, based on the idea that a correct useful skew can be obtained even if the amount of signal delay time information of the combinational circuit is limited.

Specifically, regarding signal delay time, it is generally necessary to add two kinds including maximum time and minimum time. However, in the second embodiment, (100−n) % of clock cycle Tcp, for example, only information of maximum times over 80% and n% of Tcp, for example, only information of minimum times below 20% are added and the useful skew is calculated.

Figure 7:
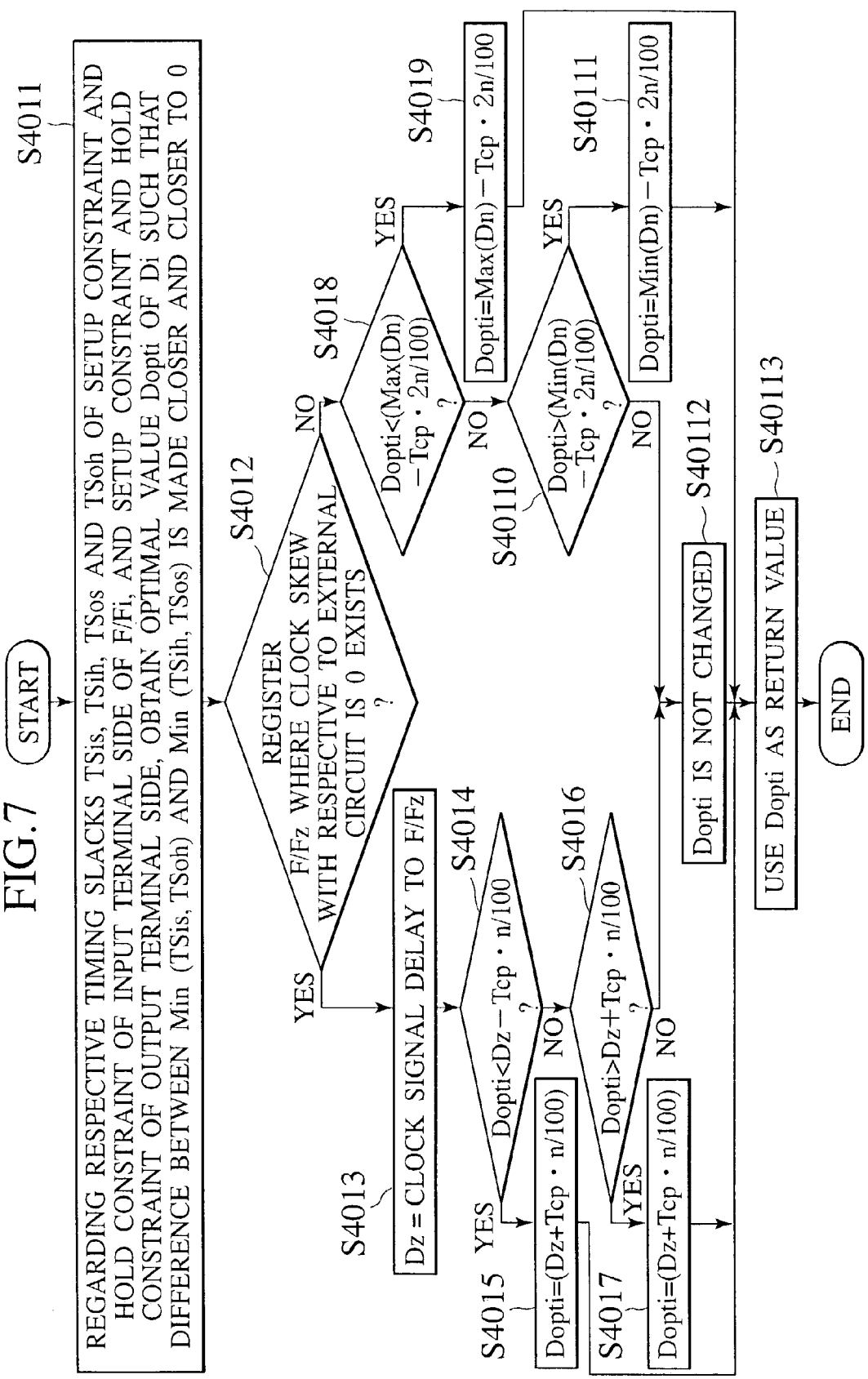
FIG. 7 is a sub-routine of a process in S401 shown in FIG. 6.

FIG. 7 is a sub-routine of step S402 shown in FIG. 6. In step S4011, regarding respective timing slacks TSis, TSih, TSos, TSoh of setup constraint of the input terminal side of F/Fi, hold constraint thereof, setup constraint of the output terminal side and hold constraint thereof, such an optimal value Dopti of Di that makes a difference between Min (TSis, TSoh) and Min (TSih, TSos) closer and closer to zero in step S4011 is obtained. Namely, Di such that the respective timing slacks are equal to each other at the input side of F/Fi and the output side thereof is set to the optimal value Dopti.

After that, in step S4012, when attention is paid to F/Fi, it is determined whether a flip-flop circuit F/Fz exists, whose clock skew with respect to an external circuit is zero. Namely, when F/Fz exists, F/Fi is connected to the external circuit, and when no F/Fz exists, F/Fi is connected to an internal circuit such as a combinational circuit When F/Fz exists, it is assumed that signal delay up to F/Fz is Dz in step S4013. When the optimal value Dopti is equal to or more than the following expression (29) in determining step S4014 and equal to or less than the following expression (30) in determining step S4016, the optimal value Dopti is not changed in step S40112.

$$Dz-Tcp \cdot n/100 \quad (29)$$

$$Dz-Tcp \cdot n/100 \quad (29)$$

When the optimal value Dopti is below expression (29) in determining step S4014, the optimal value Dopti is set to expression (29) in step S4015. When the optimal value Dopti exceeds expression (29) in determining step S4016, the optimal value Dopti is set to expression (30) in step S1047.

On the other hand, when no F/Fz exists and the optimal value Dopti is equal to or more than the following expression (31) in determining step S4018 and equal to or less than the following expression (32) in determining step S40110, the optimal value Dopti is not changed in step S40112.

$$(\text{Max}(Dn)-Tcp \cdot 2n/100) \quad (31)$$

$$(\text{Min}(Dn)-Tcp \cdot 2n/100) \quad (31)$$

When the optimal value Dopti is below expression (31) in determining step S4018, the optimal value Dopti is set to expression (31) in step S4019. When the optimal value Dopti exceeds expression (32) in determining step S40110, the optimal value Dopti is set to expression (32) in step S40111. In step S40113, each Dopti is used as a return value.

As mentioned above, when F/Fz exists, processes in steps S4013 to S4017 are carried out. Then, regarding F/Fz, a zero skew is adopted with respect to the inside and outside of the circuit, and Dopti is adjusted slightly as required. When no F/Fz exists, processes in steps S4018 to S40111 are carried out Then, regarding the flip-flop circuit having Dopti between (100−n )% of the clock cycle Tcp and n% of Tcp, a maximum value of the useful skew is limited to 2n% of Tcp as required to adjust Dopti slightly, and a circuit operation after processing result is ensured.

Processes in other steps are the same as those of the first embodiment, and the same effect is brought about Particularly, in the second embodiment, the memory amount and processing time used in step S402 can be reduced. Accordingly, in the case where a range of possible values of the useful skew is known in advance in terms of a circuit design, a maximum effect can be exerted without losing accuracy.

THIRD EMBODIMENT

Figure 8:
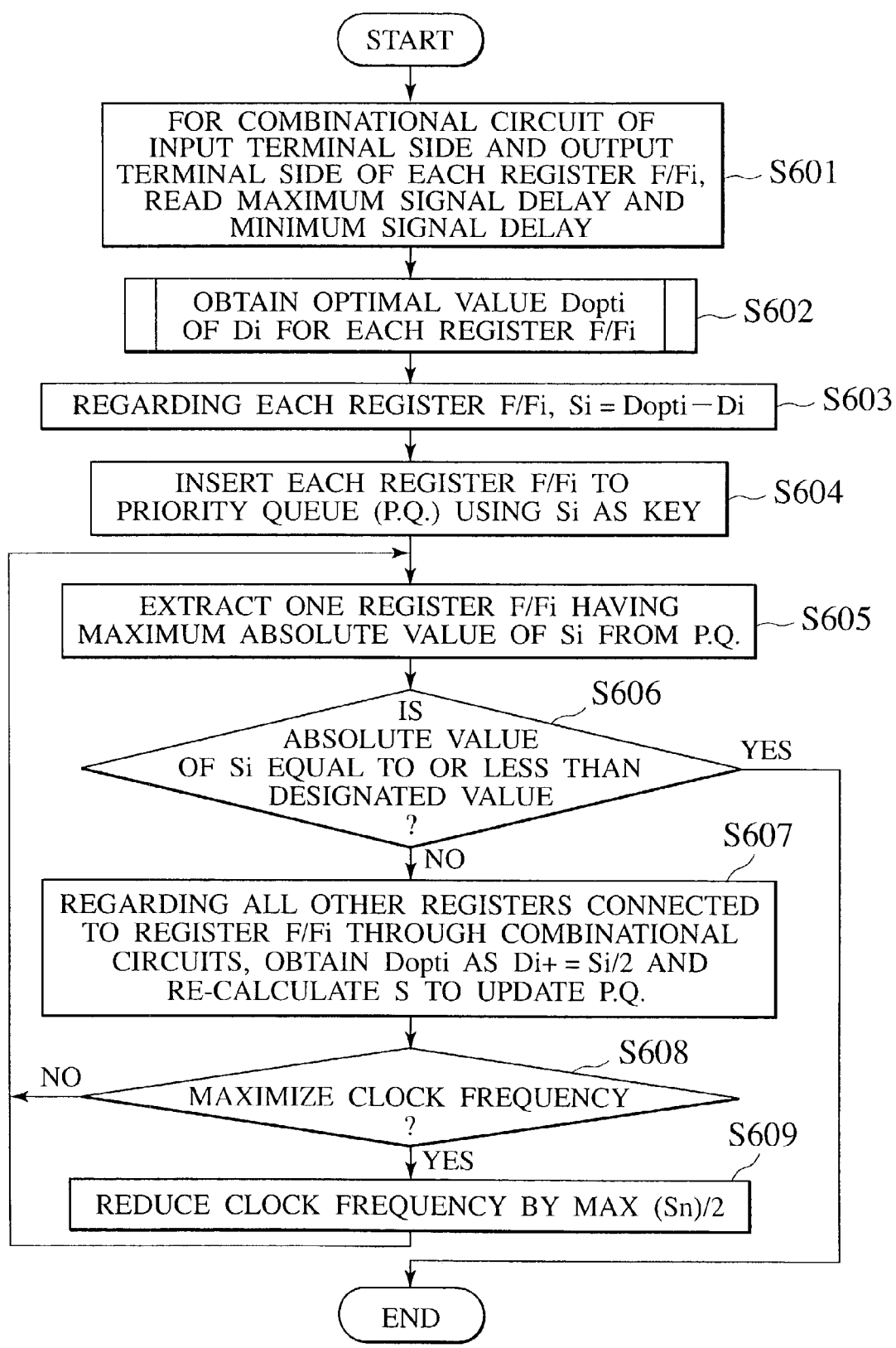
FIG. 8 is a flowchart showing the steps of a clock distributing method of a third embodiment according to the present invention.

The processes in steps of a third embodiment shown by a flowchart of FIG. 8 are substantially the same as those of the first embodiment shown in FIG. 3. However, this embodiment is different from the first embodiment in the aspect that high priority is given to either reduction of a setup time constraint violation or that of a hold time constraint violation to obtain an optimal value Dopti at the time of obtaining a useful skew in step S602. The priority is given by the user's designation to either the setup time constraint violation or the hold time constraint violation. In this case, regarding each flip-flop circuit F/Fi, at the time of obtaining Di from a value based on the setup time constraint and that based on the hold time constraint, there is provided a means for deciding Di preferentially to prevent the occurrence of violation in either of these constraints in accordance with the user's designation necessarily.

Figure 9:
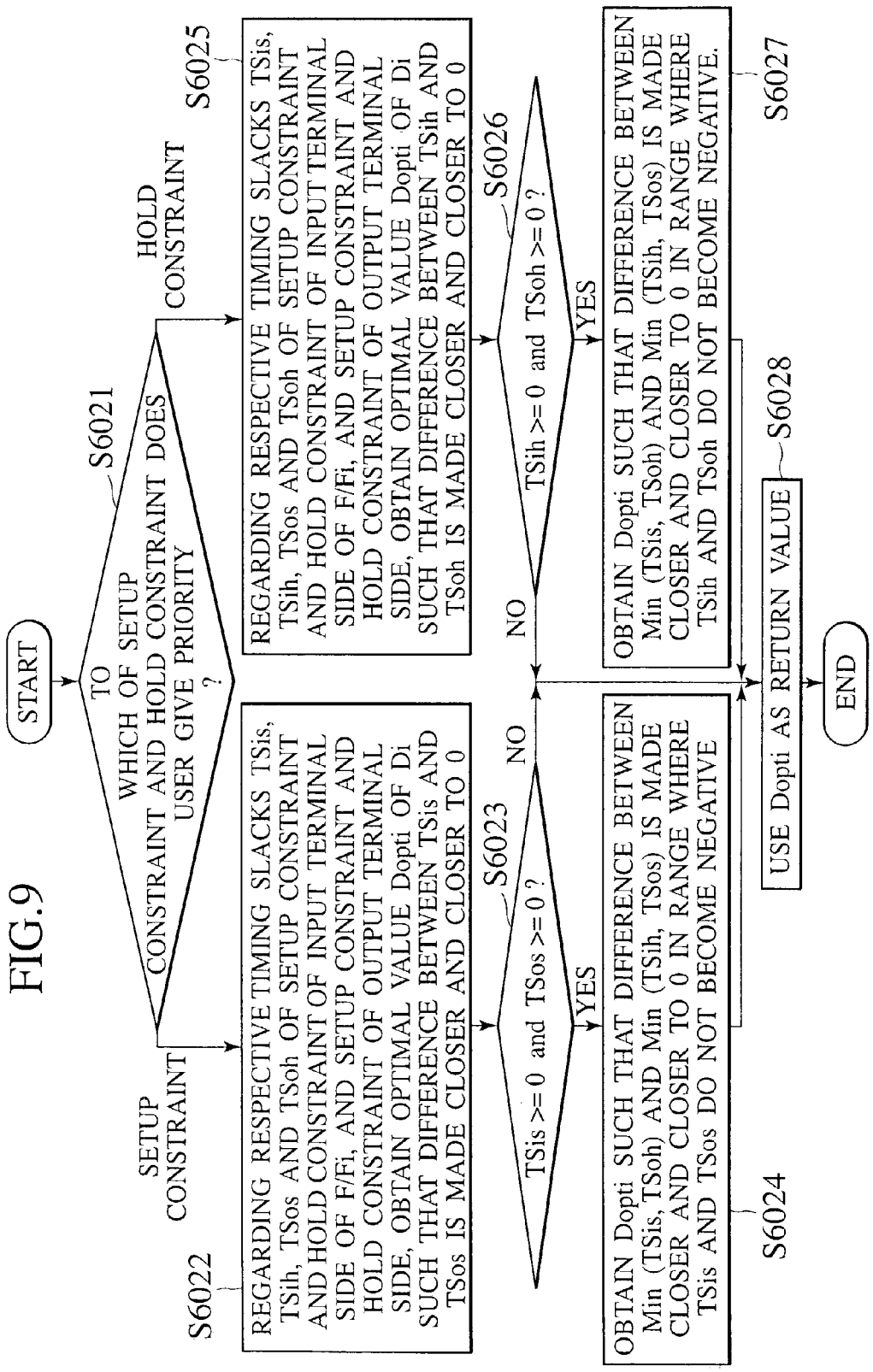
FIG. 9 is a sub-routine of a process in S602 shown in FIG. 8.

FIG. 9 is a sub-routine in step S602. In step S6021, it is determined by the user's designation whether priority is given to the setup time constraint violation or to the hold time constraint violation. In a case where the priority is given to the setup time constraint violation, the optimal value Dopti of Di is obtained by checking only the setup constraint in step S6022. After that, in the case of $TSis \geq 0$ and $TSos \geq 0$ in determining step S6023, Dopti such that a difference between Min (TSis, TSoh) and Mm (TSih, TSos) is made gradually closer to zero is obtained in a range where TSis and TSos do not become negative in step S6024. Then, in step S6028, a center of either of TSis and TSoh or TSih and TSos, whichever is severer, is used as Dopti.

In the case where priority is given to the hold time constraint violation, the optimal value Dopti of Di is obtained by checking only the hold time constraint in step S6025. After that, in the case of $TSih \geq 0$ and $TSoh \geq 0$ in determining step S6026, Dopti such that a difference between Min (TSis, TSoh) and Min (TSih, TSos) is made gradually closer to zero is obtained in a range where TSih and TSoh do not become negative in step S6027. Then, in step S6028, a center of either of TSis and TSoh or TSih and TSos, whichever is severer, is used as Dopti.

In the case where the constraint to which no priority is given cannot be checked in ether determining step S6023 or step S6026, processing goes directly to step S6028, and Dopti obtained in step S6022 or S6025 is used as it is.

According to the third embodiment, in a case where the clock frequency is not allowed to be reduced, the setup time constraint violation is reduced preferentially and the processing result is directly outputted with a warning, even with the hold time constraint violation remaining. By inserting a buffer to a location where the hold time constraint violation remains, the user can remove the violation.

Moreover, in a case where there is no room for the buffer to be inserted but a reduction in the clock frequency is possible, the hold time constraint violation can be reduced preferentially.

Additionally, the number of insertable buffers, a cell area, an increasing amount of power consumption, etc. are designated by the user, whereby the hold time constraint violation can be left in an amount which can be reduced by the foregoing, and the setup time constraint violation can be reduced preferentially in response thereto.

In sum, either one of the setup time constraint violation and the hold time constraint violation are intensively left, making it possible to correct the constraint violation of the circuit easily and to improve time-reduction in circuit preparation.

FOURTH EMBODIMENT

In order to reduce noise from the logic circuit, peak current can be reduced. In order to reduce the peak current, a plurality of flip-flop circuits that constitute the logic circuit may be turned on in such a manner that timing is delayed gradually by use of a useful skew instead of turning on them simultaneously.

Here, it is assumed that a skew boundary of one flip-flop circuit F/Fi is expressed by a mark |------|. This means that the signal delay from the CLK terminal becomes smaller as the skew boundary goes to the left end of the mark, and becomes larger as the skew boundary goes to the right end thereof A length in a horizontal direction denotes time.

Figure 10:
FIG. 10 is a view showing a clock delay setting method of a fourth embodiment according to the present invention.

For example, it is assumed that the skew boundaries of the respective F/F are shown as in FIG. 10 including signal delay values from the CLK terminal when F/F0 to F/F6 exist. Additionally, it is assumed that the circuit operates when skew=0 in all F/Fs. Therefore, there are portions where the skew boundaries of all F/Fs overlap each other.

Figure 11:
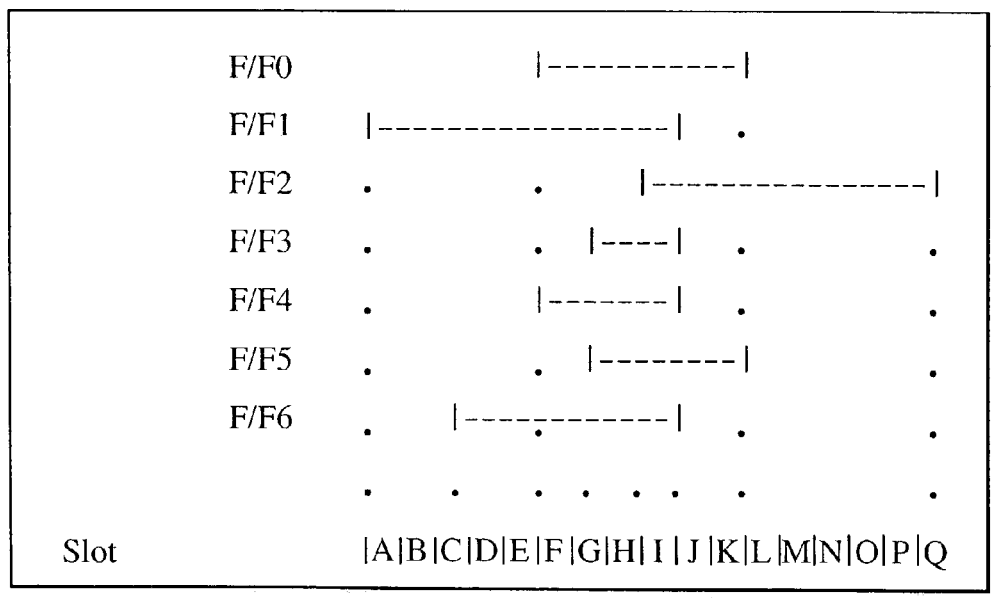

FIG. 11 is a view showing that FIG. 10 is divided at equal time intervals into time units called slots. When a probability of the presence of each flip-flop circuit (F/F0 to F/F6) is calculated based on FIG. 11, the result is as shown in FIG. 12. Thereafter, a total for each slot of FIG. 12 is added to calculate a degree of presence of the flip-flop circuit of each slot, the result is as shown in FIG. 13. In this case, weights are assigned to the degree of presence of F/F in advance, based on a current value flowing into each flip-flop circuit, making it possible to reduce the peak current. In the example set forth below, the current values of the respective F/Fs are equal to each other.

Hereafter, a constraint and an objective function are defined.

The constraint is that Di of each F/F does not overreach the skew boundary.

$$\text{Dimin} \leq Di \leq \text{Dimax} \qquad (33)$$

The objective function refers to the minimization of the current value of F/F of each slot. It is assumed that Di of each F/F where the above objective function is satisfied is a value that is shifted equally in each slot. Namely, when slots are Ta to Th and the number of F/F is n, the following expression is given.

$$Ta+(Tb-Ta)/(n+1)*1-Ta+(Tb-Ta)/(n+1)*n \quad (34)$$

Next, after an initial solution for Di of each flip-flop circuit F/F is decided, an optimizing process is executed. First, the initial solution is decided by the following procedures:

1) One slot where the degree of presence of F/F is larger than zero and its size is the smallest is taken out When there is a plurality of slots whose degree of presence is the smallest, numeric values obtained by adding the degree of presence of adjacent two slots (0 may be possible) are compared with each other so as to take out the smallest slot (this enlarges dispersion of Di). If ones having an equal degree of presence still remain, a process for adding the degree of presence of adjacent two slots is further repeated by the number of times predetermined by the user. It is assumed that the slot taken out is x. In the above example, a slot Q is taken out.

2) Of all F/Fs that can be present in the slot x, F/Fy which has the smallest flexibility (probability of presence with respect to the focused slot is maximum), is assigned to the slot. In the above example, F/F2 is assigned to the slot Q.

3) The degree of presence of F/F of each slot is updated. The degree of presence of the slot x is 1.0. Regarding each slot where F/Fy can be present, the probability of presence of F/Fy is reduced.

4) Processes from 1) are repeated until all F/Fs are assigned to a slot In this case, F/F1 is next taken out in the above example.

By the aforementioned procedure, the position of Di of each F/F is determined as shown in FIG. 15, and operating time of F/F is reduced.

Thereafter, optimizing process described below is provided to the aforementioned initial solution to obtain an optimal solution. The outline of this optimizing process is that a slot assigned to each F/F is changed from a concentrated region of operation timing of F/F to an unconcentrated region thereof so as to improve further reduced of F/F operation timing.

1) Regarding each F/Fi, a degree of improvement of F/Fi current value per unit time of each slot due to movement of Di between slots is used as a key and is inserted to a priority queue. However, in the case where the current value of F/Fi per unit time of the slot where Di is present is smaller than the other slots, no movement is performed since there is no possibility that further improvement can be obtained even if movement between the slots is performed.

2) One F/F having the highest degree of improvement is extracted from PQ.

3) When the degree of improvement is smaller than a predetermined fixed value or when Di of the same F/F is moved more than the predetermined fixed times, processing is stopped.

4) The position of Di of the extracted F/F is moved from the old slot to a new slot, and the degree of improvement on all F/F where a source slot and a destination slot can be shared is re-calculated and the result is re-inserted to PQ.

5) The processing returns to 2).

In the fourth embodiment, the initial solution of FIG. 15 is an optimal solution.

According to the fourth embodiment, F/Fs of the logic circuit is prevented from being turned on simultaneously to disperse on-timing by means of the useful skew, making it possible to reduce the peak current to reduce the generation of noise and to stabilize the voltage of the circuit.

FIFTH EMBODIMENT

A clock tree structure according to a fifth embodiment can be explained as follows. Specifically, an H tree is structured in a circuit of a clock object where each F/F has a target delay regarding F/F in a range where an H tree can be structured without a repeater (this H tree is used as nodes). A repeater is inserted to each stage of the tree up to each node from a root driver. At the H tree structuring time and repeater inserting time, a cell for delay adjustment or circuitry is added, making it possible to perform delay adjustment as a post-process.

1) One unprocessed clock system is selected from the circuit subject to a clock layout processing.

2) A net is traced from the root driver for each clock system and a Logic Equivalent Net (hereinafter referred to as LENet) is extracted for each pass-through cell.

Here, the LENet is a one-stage tree that has a pass-through cell or a root driver as a root, and has no node internally. The pass-through cell denotes a buffer that is already inserted between the root driver and the F/F to be driven before performing the clock layout and a cell to enable signal supply for use in a gated clock.

3) A cluster is generated, where target delays provided to the respective F/Fs, which have similar values to each other are collected for each LENet. One buffer, which drives the cluster, is inserted to the cluster. A target delay, which is a difference (d1−d2) between a target delay (d1) of F/F in the cluster and a delay (d2) of the interior of the cluster, is set in the buffer.

Afterward, the buffers and branch points, which drive a partial tree constituted by the clusters or combination of clusters and buffers, are referred to as representative nodes of the partial tree.

4) The respective nodes are sorted with the target delays and merged from the node with a long target delay in the range where a layout is possible by the conventional H tree structuring method, whereby performing the layout The layout ends when this merge process reaches the root driver as a result of repeating such a process. Here, the merge process is to drive a plurality of nodes together by one node.

5) Nodes, which can be merged, are subjected to the previous step repeatedly, and the merge process ends when the merge process reaches the root driver as a result of repeating such a process.

Figure 16:
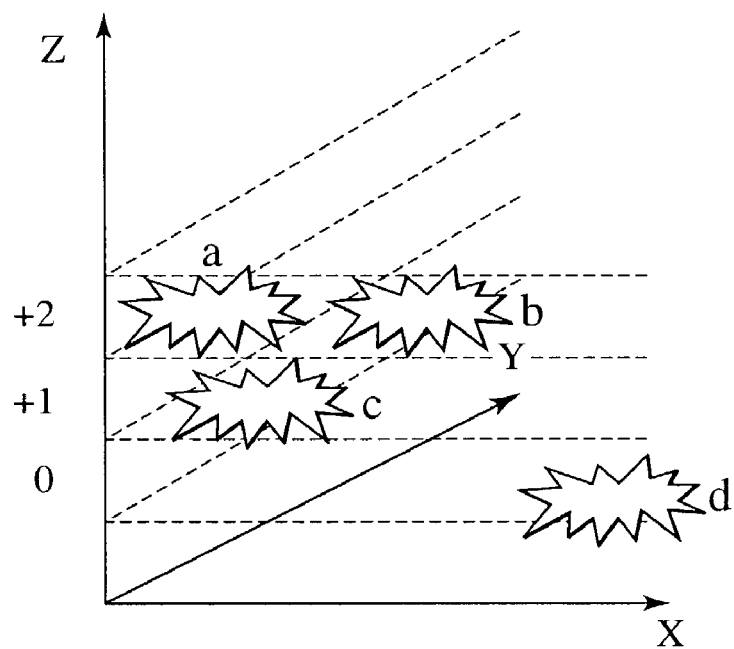
FIG. 16 is a view explaining a clock tree generating method of a fifth embodiment according to the present invention.

6) In the case where no node which can be merged is left and the remaining node is not a root driver, processing moves to a Local Buffer Tree generation mode. First, circuitry is temporarily performed from the root driver to the node which is left without being merged (this is called a leaf) like a star in a one-to-one relationship (FIG. 16). When there is an obstacle (mega cell, etc.) on a straight line connecting the root driver and the leaf, a path search is carried out to search for an alternative path. In such a case, a temporary path is set 7) The positions and number of repeater buffers required are calculated in accordance with the temporary path. In this case, the buffer that is inserted to each path is adjusted such that the target delays coincide with each other at the root driver side and can be merged. First, the root driver is a focused node.

8) It is determined whether or not the first buffer from the focused node can be subjected to merging processing (merging into one). At this time, it is assumed that the buffer subjected to merging processing is placed at the center of gravity. The above determination is made depending on whether or not the merging processing exceeds the constraints of delay and design.

Figure 17:
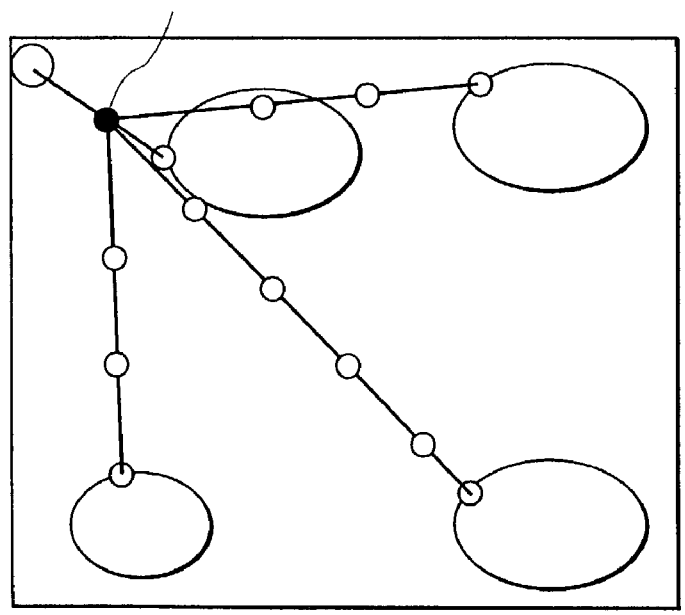
FIG. 17 is a view explaining the clock tree generating method of the fifth embodiment according to the present invention.

9) In the case where the merging into one is possible, the buffers are merged into one, the merged buffer is used as a focused node, and 8) is repeated (FIG. 17).

Here, in the case where merging is impossible, a delay calculation which ranges from the root driver to the leaf is carried out to select a leaf in order that the delay exceeds a target. Then, the buffers on the path are excluded from the object to be subjected to merging processing, and the remaining buffers are subjected to merging processing again. The buffers are divided into two groups with Bi-section processing, and each group is repeatedly subjected to the aforementioned processing recursively. Such recursive processing continues until the focused node reaches the leaf 10) Processing goes back to the process of 1), and the aforementioned processes are repeated for the duration of time that an unprocessed clock system exists.

According to the fifth embodiment, circuitry is temporarily performed from the root driver to the node which is left without being merged like a star. The buffers, which are on the temporary circuitry and which can be subjected to merging processing, are merged into one. It is thereby possible to eliminate unnecessary increases in the number of buffers and to shorten a line length even if the distribution of F/Fs to be driven is uneven. Accordingly, it is possible to generate a high performance tree with little increase in delay.

SIXTH EMBODIMENT

A sixth embodiment is a method for generating an H tree portion when each F/F has a target delay.

Figure 18:
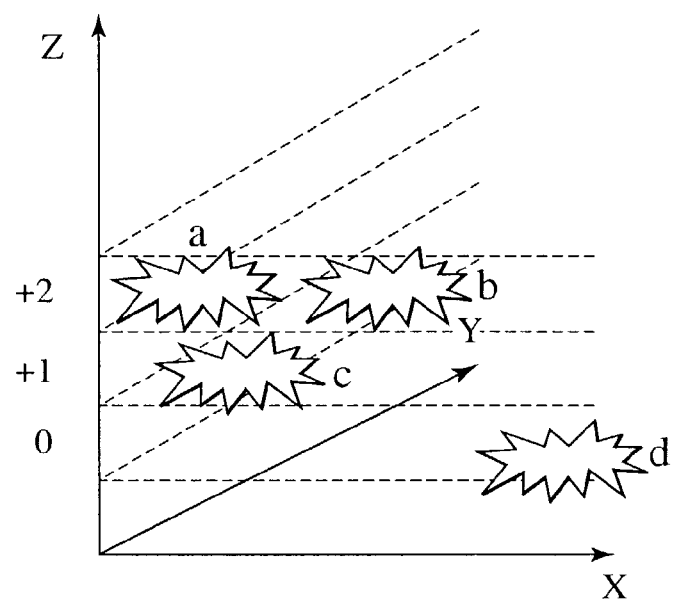
FIG. 18 is a view explaining a clock tree generating method of a sixth embodiment according to the present invention.

1) The respective F/Fs are sorted by target delays and then classified by delay of the grade which inserts one stage of buffer (this means dividing according to each time slice). After that, as shown in FIG. 18, each F/F is positioned in an xyz-space, where position information of nodes are added and where x and y represent position information and z represents time slice information. In FIG. 18, a z-direction indicates delay time of target clocks of groups a to d of F/Fs and positions of groups a to d of F/Fs on a chip are indicated on an x-y plane.

2) The merge process is carried out from nodes existing in the time slice with long target delays. The merge process is to drive a plurality of nodes together by one node. At the time of merging, a range where a delay calculation is performed from a position of a branch point and the node can be driven at the buffer stage is selected. In the case where only one node which can be merged is left in the time slice, a buffer is suitably added to adjust the target delay, whereby the node is registered in another time slice.

3) A target delay is reset with respect to a newly formed node and is newly registered in a time slice.

4) Processes 1) to 3) are repeated at the same time slice by the amount that can be processed. When the processes cannot be continued, processing goes to processing for next large time slice.

Figure 19:
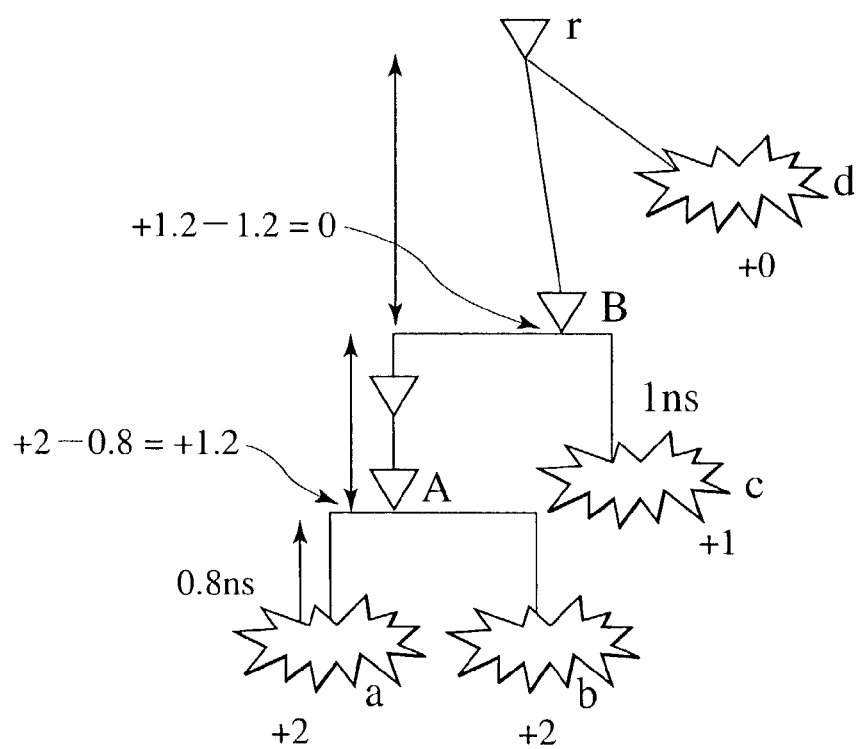
FIG. 19 is a view explaining the clock tree generating method of the sixth embodiment according to the present invention.

The aforementioned processes 1) to 4) will be further explained using FIG. 19. First, since groups a and b of F/Fs are at a time slice of 2n seconds, a buffer A is inserted to the front stage of the groups a and b of F/Fs to improve the clock delay time by 0.8 n second. Thereby, the groups a and b of F/Fs are registered at a time slice of in second and their time slice becomes the same as that of a group c of F/Fs. Then, a buffer B is inserted to the front stage of groups a, b and c of F/Fs to improve the clock delay time by 1. 2n seconds. Thereby, in the groups a, b and c of F/Fs, a clock skew is improved by substantially the same amount as the target delay, so that the groups a, b and c of F/Fs are registered to the same time slice as that of group d of F/Fs.

5) The aforementioned processes 1) to 4) are repeatedly provided to the nodes that can be merged.

According to the sixth embodiment, F/Fs having a similar target delay are classified to obtain groups of F/Fs for each target delay, and these groups of F/Fs are registered to the corresponding time slice. After that, the delay of the group of F/Fs for each time slice is improved to be brought close to the target delay, and the improved group of F/Fs is registered to the corresponding time slice again and delay of the group of F/Fs for each time slice is improved so as to be brought close to the target delay. Such processing is repeated, making it possible to perform the improvement of the clock delay time with respect to the plurality of target delays systematically and efficiently.

In addition, after processing that improves the clock delay time by the clock tree generating method according to the sixth embodiment, merging processing is performed by the clock tree generating method according to the fifth embodiment. It is thereby possible to structure the clock tree of the logic circuit using, for example, a useful skew easily and efficiently.

SEVENTH EMBODIMENT

Figure 20:
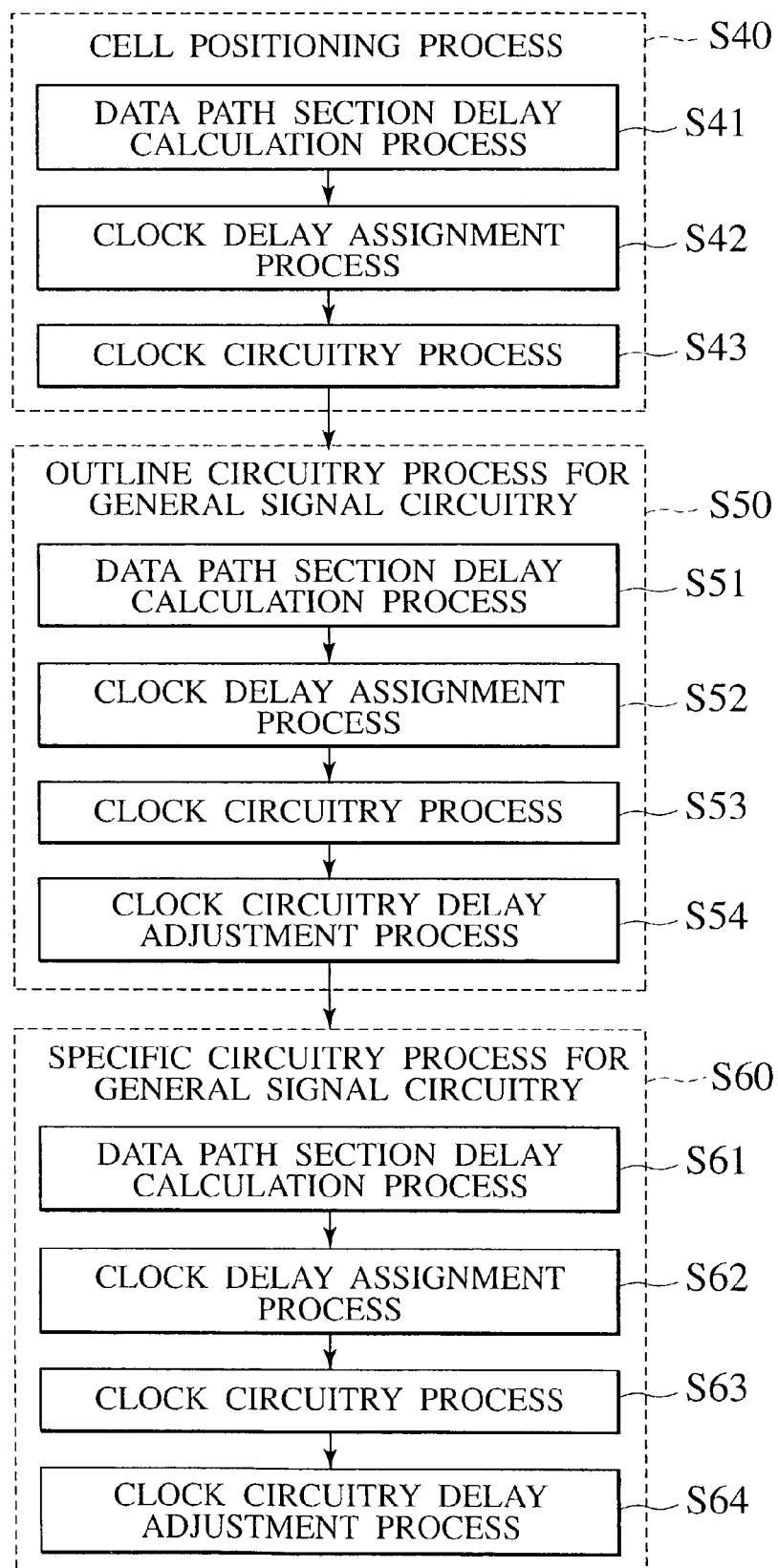
FIG. 20 is an explanatory view showing the steps of a circuitry process method of a seventh embodiment according to the present invention.

According to a circuitry process method of a seventh embodiment, as shown in FIG. 20, in a cell positioning process S40, a data path section delay calculation process S41, a clock delay assignment process S42 and a clock circuitry process S43 are performed. Sequentially, in an outline circuitry process S50 for general signal circuitry, a data path section delay calculation process S51, a clock delay assignment process S52, a clock circuitry process S53 and a clock circuitry delay adjustment process S54 are performed. Finally, in a specific circuitry process S60 for general signal circuitry, a data path section delay calculation process S61, a clock delay assignment process S62, a clock circuitry process S63 and a clock circuitry delay adjustment process S64 are performed.

Figure 21:
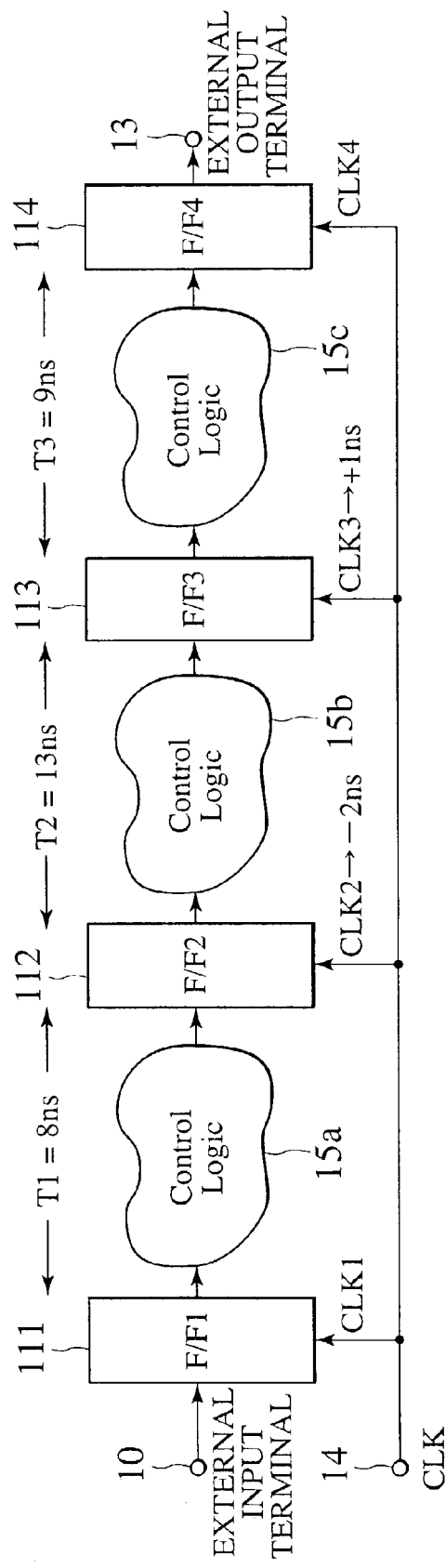
FIG. 21 is a block diagram explaining clock delay assignment process shown in FIG. 20.

Hereafter, an explanation will be given of clock delay assignment processes S42, S52 and S62 using FIG. 21. A circuit shown in FIG. 21 includes a F/F1 circuit 111 that receives an input signal from an external input terminal 10 and a clock signal from a CLK terminal 14, a first control logic circuit 15a that receives an output from the F/F1 circuit 111, a F/F2 circuit 112 that receives an output from the first control logic circuit i5a and a clock signal CLK 2 from the CLK terminal 14, a second control logic circuit 15b that receives an output from the F/F2 circuit 112, a F/F3 circuit 113 that receives an output from the second control logic circuit 15b and a clock signal CLK 3 from the CLK terminal 14, a third control logic circuit 15c that receives an output from the F/F3 circuit 113, a F/F4 circuit 114 that receives an output from the third control logic circuit 15c and a clock signal CLK 4 from the CLK terminal 14, and an external output terminal 13 that finally outputs a signal from the F/F4 circuit 114.

It is assumed that the clock frequency is 100 MHz and that data path delays T1, T2 and T3 are T1=8 ns, T2=13 ns and T3=9 ns, respectively. In such a case, as shown in FIG. 21, performance of the entire system is limited by T2 that takes the most time. For this reason, in order to improve a cycle time (performance of the system), the clock skew is adjusted as follows. Namely, CLK 2 is set to arrive at the F/F2 circuit 112 early, and CLK 3 is set to arrive at the F/F3 circuit 113 later. In the case of this example, CLK 2 is designed to arrive at the F/F2 circuit 112 early by 2 ns, and CLK 3 is designed to arrive at the F/F3 circuit 113 later by ins.

According to the seventh embodiment, since the data path section delay calculation process S61 and the clock delay assignment process S62 are carried out after performing the outline circuitry process for general signal circuitry, it is possible to consider the clock delay due to circuitry. For this reason, even if a bias is found in the distribution of the F/F, it is possible to generate a clock layout with good performance (the number of buffers is small and an increase in delay is low). Accordingly, even when it is necessary to adjust the clock delay finely using the useful skew, it is possible to set the clock delay accurately as designed.

Various modifications will become possible for those skilled in the art after receiving the teachings of the present disclosure without departing from the scope thereof.

What is claimed is:

1. A method for distributing clocks to flip-flop circuits which constitute a logic circuit, the method comprising:
    obtaining a timing slack of a first minimum delay time with respect to a minimum delay constraint time and a timing slack of a first maximum delay time with respect to a maximum delay constraint time for a clock in an input path to a flip-flop circuit;
    obtaining a timing slack of a second minimum delay time with respect to a minimum delay constraint time and a timing slack of a second maximum delay time with respect to a maximum delay constraint time for a clock in an output path from all the flip-flop circuits which receive the clocks from a clock terminal directly; and
    obtaining a delay value which maximizes a minimum value of each of the first and second minimum delay time and maximum delay time of timing slacks.

2. The method according to claim 1, further comprising inserting a device having the delay value to a clock path of the flip-flop circuit to shift a timing change of a clock to be distributed to the flip-flop circuit with respect to timing changes of clocks to be distributed to other flip-flop circuits.

3. The method according to claim 1, further comprising deleting a device having the delay value from a clock path of the flip-flop circuit to shift a timing change of a clock to be distributed to the flip-flop circuit with respect to timing changes of clocks to be distributed to other flip-flop circuits.

4. The method according to claim 1, further comprising inserting circuitry having the delay value to a clock path of the flip-flop circuit to shift a timing change of a clock to be distributed to the flip-flop circuit with respect to timing changes of clocks to be distributed to other flip-flop circuits.

5. The method according to claim 1, further comprising deleting circuitry having the delay value from a clock path of the flip-flop circuit to shift a timing change of a clock to be distributed to the flip-flop circuit with respect to timing changes of clocks to be distributed to other flip-flop circuits.

6. A method for distributing clocks to flip-flop circuits which constitute a logic circuit, the method comprising:
    performing a constraint verification as to whether a first minimum delay time of a clock in an input path to a flip-flop circuit is larger than a minimum delay constraint time;
    performing a constraint verification as to whether all of respective first maximum delay times of a clock in an output pat from all the flip-flop circuits which receive the clocks from a clock terminal directly are smaller than a maximum delay constraint time;
    obtaining a first degree of allowance, which is a difference between respective delay times of the minimum delay time of the clock and the maximum delay time of the clock with respect to the minimum delay constraint time and the maximum delay constraint time;
    performing a constraint verification as to whether a second maximum delay time of the clock in the input path to the flip-flop circuit is smaller than a maximum delay constraint time;
    performing a constraint verification as to whether all of respective second minimum delay times of the clock in the output path from all the flip-flop circuits which receive the clocks from the clock terminal directly are larger than a minimum delay constraint time to which a clock skew in clock distribution is added; and
    obtaining a second degree of allowance, which is a difference between respective delay times of the maximum delay time of the clock and the minimum delay time of the clock with respect to the maximum delay constraint time and the minimum delay constraint time.

7. The method according to claim 6, further comprising inserting a device having a delay smaller than a minimum value of an absolute value of the first degree of allowance to a clock path of the flip-flop circuit so as to shift a timing change of a clock to be distributed to the flip-flop circuit with respect to timing changes of clocks to be distributed to other flip-flop circuits when an absolute value of the first degree of allowance is larger than an absolute value of the second degree of allowance.

8. The method according to claim 6, further comprising inserting circuitry having a delay smaller than a minimum value of an absolute value of the first degree of allowance to a clock path of the flip-flop circuit so as to shift a timing change of a clock to be distributed to the flip-flop circuit with respect to timing changes of clocks to be distributed to other flip-flop circuits when an absolute value of the first degree of allowance is larger than an absolute value of the second degree of allowance.

9. The method according to claim 6, further comprising deleting a device having a delay smaller than a minimum value of an absolute value of the second degree of allowance from a clock path of the flip-flop circuit so as to shift a timing change of a clock to be distributed to the flip-flop circuit with respect to timing changes of clocks to be distributed to other flip-flop circuits when an absolute value of the first degree of allowance is smaller than an absolute value of the second degree of allowance.

10. The method according to claim 6, further comprising deleting circuitry having a delay smaller than a minimum value of an absolute value of the second degree of allowance from a clock path of the flip-flop circuit so as to shift a dining change of a clock to be distributed to the flip-flop circuit with respect to timing changes of clocks to be distributed to other flip-flop circuits when an absolute value of the first degree of allowance is smaller than an absolute value of the second degree of allowance.

11. A method for distributing clocks to flip-flop circuits which constitute a logic circuit, the clock distribution method comprising:
    performing a first constraint verification as to whether a first maximum delay time of a clock in an input path to a flip-flop circuit is larger than a maximum delay constraint time and there is a violation; and
    performing a second constraint verification as to whether there is a violation in which at least one of first respective minimum delay times of a clock in an output path from any one of the flip-flop circuits which receive the clocks from a clock terminal directly is smaller than a corresponding minimum delay constraint time.

12. The method according to claim 11, further comprising:

performing a third constraint verification as to whether the first maximum delay time of the clock in the input path to the flip-flop circuit is smaller than the maximum delay constraint time to which a clock skew in the clock distribution is added when there is a violation of delay constraint time by a delay time;

performing a fourth constraint verification as to whether a second minimum delay time of the clock in the input path to the flip-flop circuit is lager than a minimum delay constraint time to which a clock skew in the clock distribution is added;

performing a fifth constraint verification as to whether all of the first respective minimum delay times of the clock in the output path from all the flip-flop circuits which receive the clocks from a clock terminal directly are larger than the minimum delay constraint time from which a clock skew in the clock distribution is subtracted;

performing a sixth constraint verification as to whether all of second respective maximum delay times of the clock in the output pat from all the flip-flop circuits which receive the clocks from the clock terminal directly are smaller than a maximum delay constraint time from which a clock skew in the clock distribution is subtracted;

obtaining degrees of allowance, which are differences between respective delay times with respect to all the delay constraint times; and inserting a device having a delay smaller than a minimum value of absolute values of the degrees of allowance to a clock path of the flip-flop circuit to shift a timing change of a clock to be distributed to the flip-flop circuit with respect to timing changes of clocks to be distributed to other flip-flop circuits.

13. The method according to claim 11, further comprising:

performing a third constraint verification as to whether the first maximum delay time of the clock in the input path to the flip-flop circuit is smaller than the maximum delay constraint time to which a clock skew in the clock distribution is added when there is a violation of delay constraint time by a delay time;

performing a fourth constraint verification as to whether a second minimum delay time of the clock in the input path to the flip-flop circuit is larger than a minimum delay constraint time to which a clock skew in the clack distribution is added;

performing a fifth constraint verification as to whether all of the first respective minimum delay times of the clock in the output path from all the flip-flop circuits which receive the clocks from a clock terminal directly are larger than the minimum delay constraint time from which a clock skew in the clock distribution is subtracted;

performing a sixth constraint verification as to whether all of second respective maximum delay times of the clock in the output pat from the flip-flop circuit with respect to all flip-flop circuits which can be directly reached and the external output terminal are smaller than a maximum delay constraint time from which a clock skew in the clock distribution is subtracted;

obtaining degrees of allowance, which are differences between respective delay times with respect to the all delay constraint times; and inserting circuitry having a delay smaller than a minimum value of absolute values of the degrees of allowance to a clock path of the flip-flop circuit to shift a timing change of a clock to be distributed to the flip-flop circuit with respect to timing changes of clocks to be distributed to other flip-flop circuits.

14. A method in which a permissible range of a clock signal delay time from a clock input terminal of a logic circuit to an input of each flip-flop circuit that constitutes the logic circuit is set as a skew boundary and in which a signal delay time of each flip-flop circuit is set within the skew boundary, wherein the signal delay time of to flip-flop circuit is dispersed and there is an absence of overlap.

15. A method in which a permissible range of a clock signal delay time from a clock input terminal of a logic circuit to an input of each flip-flop circuit that constitutes the logic circuit is set as a skew boundary and in which a signal delay time of each flip-flop circuit is set within the skew boundary, the method comprising:

extracting a unit time width where there is a flip-flop circuit having a degree of presence larger than zero and is the smallest of unit time widths set at a time axis that counts the skew boundary by a first extracting process, wherein the degree of presence indicates total probability of presence of flip-flop circuits in the unit time;

comparing numeric values where the degrees of presence of two adjacent unit time widths are added to extract a minimum unit time width by a second extracting process when the number of the extracted unit time widths whose degree of presence is the smallest is more than two or more;

using the extracted unit time width as a first slot;

assigning a flip-flop circuit having the smallest flexibility of flip-flop circuits, which can be present in the first slot, to the first slot; and executing an update process of the degree of presence of the flip-flop circuit having delay time that is present in each unit time width.

16. The method according to claim 15, further comprising repeating the second extracting process of the smallest unit time width by the number of predetermined times when there is left a unit time width where the flip-flop circuits having the degrees of presence are the same.

17. The method according to claim 16, further comprising repeating processes including the first extraction process to the update process until delay times of all flip-flop circuits are assigned to a unit time width.

18. The method according to claim 17, wherein each of the signal delay times of the flip-flop circuits, having signal delay times separately assigned to the unit time widths, is moved between the unit time widths;

the flip-flop circuit is configured to be inserted to a priority queue using a degree of improvement of a current value per unit time of the flip-flop circuit having the signal delay time moved between the unit dine widths as a key;

one flip-flop circuit having a maximum degree of improvement is extracted from the priority queue; and a position of the signal delay time of the extracted flip-flop circuit is moved to a unit time width of a moving destination from an original unit time width, degrees of improvement of all flip-flop circuits, which are capable of sharing the unit time width of a moving source and the moving destination, are re-calculated, and re-inserted to the priority queue.

19. The method according to claim 18, wherein when the degree of improvement of the current value is smaller than a predetermined fixed value, the extraction and the re-insertion are repeated until the signal delay time of the same flip-flop circuit moves between the unit time widths greater than a predetermined fixed time.

20. The method according to claim 16,
wherein each of the signal delay times of the flip-flop circuits, having signal delay times separately assigned to the unit time widths, is moved between the unit time widths;
the flip-flop circuit is configured to be inserted to a priority queue using a degree of improvement of a current value per unit time of the flip-flop circuit having the signal delay time moved between the unit time widths as a key;
one flip-flop circuit having a maximum degree of improvement is extracted from the priority queue; and
a position of the signal delay time of the extracted flip-flop circuit is moved to a unit time width of a moving destination from an original unit time width, degrees of improvement of all flip-flop circuits, which are capable of sharing the unit time width of a moving source and the moving destination, are re-calculated, and re-inserted to the priority queue.

21. The method according to claim 20, wherein when the degree of improvement of the current value is smaller than a predetermined fixed value, the extraction and the re-insertion are repeated until the signal delay time of the same flip-flop circuit moves between the unit time widths greater than a predetermined fixed time.

22. The method according to claim 15, further comprising repeating processes including the first extraction process to the update process until the delay times of all flip-flop circuits are separately assigned to the unit time widths.

23. The method according to claim 22,
wherein each of the signal delay times of the flip-flop circuits, having signal delay times separately assigned to the unit time widths, is moved between the unit time widths;
the flip-flop circuit is configured to be inserted to a priority queue using a degree of improvement of a current value per unit time of the flip-flop circuit having the signal delay time moved between the unit time widths as a key;
one flip-flop circuit having a maximum degree of improvement is extracted from the priority queue; and
a position of the signal delay time of the extracted flip-flop circuit is moved to a unit time width of a moving destination from an original unit time width, degrees of improvement of all flip-flop circuits, which are capable of sharing the unit time width of a moving source and the moving destination, are re-calculated, and re-inserted to the priority queue.

24. The method according to claim 23, wherein when the degree of improvement of the current value is smaller than a predetermined fixed value, the extraction and the re-insertion are repeated until the signal delay time of the same flip-flop circuit moves between the unit time widths greater than a predetermined fixed time.

25. The method according to claim 15,
wherein each of the signal delay times of the flip-flop circuits, having signal delay times separately assigned to the unit time widths, is moved between the unit time widths,
the flip-flop circuit is configured to be inserted to a priority queue using a degree of improvement of a current value per unit time of the flip-flop circuit having the signal delay time moved between the unit time widths as a key,
one flip-flop circuit having a maximum degree of improvement is extracted from the priority queue, and
a position of the signal delay time of the extracted flip-flop circuit is moved to a unit time width of a moving destination from an original unit time width, degrees of improvement of all flip-flop circuits, which are capable of sharing the unit time width of a moving source and the moving destination, are re-calculated, and re-inserted to the priority queue.

26. The method according to claim 25, wherein when the degree of improvement of the current value is smaller than a predetermined fixed value, the extraction and the re-insertion are repeated until the signal delay time of the same flip-flop circuit moves between the unit time widths greater than a predetermined fixed time.

27. A method for generating a clock tree of a logic circuit, the method comprising: replacing a plurality of buffers inserted between a root driver and an H tree with one buffer, and connecting the root driver and said one buffer by one circuitry.

28. A method for generating a clock free of a logic circuit, the clock tree generating method comprising:
classifying flip-flop circuits which have similar target delays to each other for each target delay as groups of flip-flop circuits;
making the group of flip-flops having the largest target delay close to the target delay, and
re-classifying the flip-flop circuits which have similar target delays to each other for each target delay as groups of flip-flop circuits.

29. The method according to claim 28, wherein the re-classification is repeated until all groups of flip-flop circuits achieves the target delays.

30. A method for a circuitry process, comprising:
a cell positioning process;
an outline circuitry process for a general signal circuitry; and
a specific circuitry process for the general signal circuitry;
wherein a delay calculation process for a data path section and a clock delay assignment process are carried out in the outline circuitry process for the general signal circuitry.

* * * * *